US009123627B1

(12) United States Patent
Qi et al.

(10) Patent No.: US 9,123,627 B1
(45) Date of Patent: Sep. 1, 2015

(54) METHODS OF FORMING ALTERNATIVE MATERIAL FINS WITH REDUCED DEFECT DENSITY FOR A FINFET SEMICONDUCTOR DEVICE

(71) Applicant: GLOBALFOUNDRIES Inc., Grand Cayman (KY)

(72) Inventors: Yi Qi, Niskayuna, NY (US); Ajey Poovannummoottil Jacob, Watervliet, NY (US); Shurong Liang, Poughkeepsie, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/267,010

(22) Filed: May 1, 2014

(51) Int. Cl.

| | |
|---|---|
| ***H01L 29/165*** | (2006.01) |
| ***H01L 29/66*** | (2006.01) |
| ***H01L 29/36*** | (2006.01) |
| ***H01L 21/306*** | (2006.01) |
| ***H01L 21/322*** | (2006.01) |

(52) U.S. Cl.
CPC ........ *H01L 29/165* (2013.01); *H01L 21/30608* (2013.01); *H01L 21/3221* (2013.01); *H01L 29/36* (2013.01); *H01L 29/66795* (2013.01)

(58) Field of Classification Search
CPC .............. H01L 29/36; H01L 21/30608; H01L 21/3221; H01L 29/66795
See application file for complete search history.

(56) References Cited

U.S. PATENT DOCUMENTS

| | | | | |
|---|---|---|---|---|
| 6,762,448 | B1 * | 7/2004 | Lin et al. | 257/302 |
| 6,972,461 | B1 * | 12/2005 | Chen et al. | 257/347 |
| 7,679,134 | B1 * | 3/2010 | Buynoski et al. | 257/329 |
| 7,851,865 | B2 * | 12/2010 | Anderson et al. | 257/365 |

OTHER PUBLICATIONS

Paul, "Silicon-Germanium Strained Layer Materials in Microelectronics," Advanced Materials, 11:191-204, 1999.

* cited by examiner

*Primary Examiner* — Richard Booth
(74) *Attorney, Agent, or Firm* — Amerson Law Firm, PLLC

(57) ABSTRACT

One method disclosed herein includes removing at least a portion of a fin to thereby define a fin trench in a layer of insulating material, forming first and second layers of semiconductor material in the fin trench, after forming the second layer of semiconductor material, performing an anneal process to induce defect formation in at least the first layer of semiconductor material, wherein, after the anneal process is performed, the upper surface of the second layer of semiconductor material is substantially defect-free, forming a layer of channel semiconductor material on the upper surface of the second layer of semiconductor material and forming a gate structure around at least a portion of the channel semiconductor material.

25 Claims, 18 Drawing Sheets

100 W 3L 104U 132 112 104S 110 130T 120 104 130 102 102X 102S 3L 130 134A

100 L 112 110 132 120 130T 130 102 102S 130 134A

METHODS OF FORMING ALTERNATIVE MATERIAL FINS WITH REDUCED DEFECT DENSITY FOR A FINFET SEMICONDUCTOR DEVICE

BACKGROUND OF THE INVENTION

1. Field of the Invention

Generally, the present disclosure relates to the manufacture of FET semiconductor devices, and, more specifically, to various methods of forming alternative material fins with reduced defect density for a FinFET semiconductor device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A conventional FET is a planar device that typically includes a source region, a drain region, and a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed and in lowering operation currents and voltages of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a planar FET, there are so-called 3D devices, such as an illustrative FinFET device, which is a three-dimensional structure. FIG. 1A is a perspective view of an illustrative prior art FinFET semiconductor device A that is formed above a semiconductor substrate B. The device A includes three illustrative fins C, a gate structure D, sidewall spacers E and a gate cap layer F. The gate structure D is typically comprised of a layer of insulating material (not separately shown), e.g., a layer of high-k insulating material, and one or more conductive material layers that serve as the gate electrode for the device A. In this example, the fins C are comprised of a substrate fin portion C1 and an alternative fin material portion C2. The substrate fin portion C1 may be made of silicon, i.e., the same material as the substrate, and the alternative fin material portion C2 may be made of a material other than the substrate material, for example, silicon-germanium, germanium, II-V materials, etc. The fins C have a three-dimensional configuration: a height H, a width W and an axial length L. The axial length L corresponds to the direction of current travel in the device A when it is operational. The portions of the fins C covered by the gate structure D are the channel regions of the FinFET device A.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance capability and reliability of such devices. Device designers are currently investigating using alternative semiconductor materials, such as silicon/germanium, germanium and so-called III-V materials, to manufacture FinFET devices which are intended to enhance the performance capabilities of such devices, e.g., to enable low-voltage operation.

However, the integration of such alternative materials on silicon substrates (the dominant substrates used in the industry) is a non-trivial matter due to, among other issues, the large difference in lattice constants between such alternative materials and silicon. That is, with reference to FIG. 1A, the lattice constant of the alternative fin material portion C2 of the fin C may be greater than the lattice constant of the substrate fin portion C1 of the fin C. As a result of this mismatch in lattice constants, an unacceptable number of defects may be formed or created in the alternative fin material portion C2. As used herein and in the claims attached hereto, a "defect" is a misfit dislocation in the crystalline structure of the alternative fin material portion C2 of the fin C.

With respect to forming such lattice-constant-mismatched materials on one another, there is a concept that is generally referred to as the "critical thickness" of a material. Critical thickness is defined as the minimum thickness of a completely strained heterostructure material substantially without any defects such as dislocations. In the case where a material is formed to a thickness that is less than its critical thickness, the material stays in a "stable" state, wherein it is in a fully-strained condition that is 100% strained in at least one crystalline plane of the material. In the case where a material is formed to a thickness that is greater than its critical thickness, the material is in a "relaxed-with-defects" state and it has zero or partial strain in all crystalline planes. However, the "critical thickness" of a material may not be constant for all situations. For example, when the growth temperature used in forming the material is very low, the resulting material could be in a "metastable" state where it remains fully strained to the same level as a material in the above-described stable state, but the metastable material is in an unstable condition wherein it will relax readily, with the resulting formation of defects, upon application of a relatively large amount of thermal energy to the metastable material.

FIG. 1B is a graph taken from an article entitled "Silicon-Germanium Strained Layer Materials in Microelectronics" by Douglas J. Paul that was published in *Advanced Materials* magazine (11(3), 101-204 (1999)). FIG. 1B graphically depicts these three conditions for silicon-germanium materials ($Si_{1-x}Ge_x$; x=0-1). The vertical axis is the critical thickness in nanometers. The horizontal axis is the concentration of germanium in the silicon-germanium material. At the leftmost point on the horizontal axis is pure silicon (Ge concentration equals 0.0). At the rightmost point on the horizontal axis is pure germanium (Ge concentration equals 1.0). The two curves R and S define the stable, metastable and relaxedwith-defects regions for silicon-germanium materials having differing germanium concentration levels. Above and to the right of curve R are materials that are in the relaxed-with-defects condition. Below and to the left of curve S are materials that are in the stable condition. The region between the two curves R and S defines the region where materials are in the metastable condition.

To add more precision to the terminology regarding critical thickness, the term "stable critical thickness" will be used herein and in the attached claims to refer to a maximum thickness of a material at which it may be formed in a substantially defect-free and "fully-strained" condition above a substrate material, i.e., in an unconfined growth environment. Additionally, as used herein and in the attached claims, the term "metastable critical thickness" will be used to refer to a maximum thickness of a material at which it may be formed in a metastable condition above a substrate material, i.e., in certain growth environments. As noted above, a material in the metastable condition is not stable and could be relaxed (with the associated defect being formed) relatively quickly when the environment is changed, e.g., when the metastable material is annealed. Nevertheless, a material that is in a metastable state is still fully strained and substantially defect-free.

With reference to FIG. 1B, a layer of pure germanium (Ge concentration equal to 1.0) may be in the stable condition at a thickness up to about 1-2 nm (point CT1) and it may be in a metastable condition for thicknesses between about 2-4 nm (point CT2). Above a thickness of about 4 nm, a layer of pure germanium will be in the relaxed-with-defects condition. In contrast, a layer of silicon-germanium with a 50% concentration of germanium may be in the stable condition at thicknesses up to about 4 nm (point CT3) and it may be in a metastable condition for thicknesses between about 4-30 nm (point CT4). Above a thickness of about 30 nm, a layer of silicon-germanium with a 50% concentration of germanium will be in the relaxed-with-defects condition. Again, this critical thickness is the thickness of a material as it is grown on a planar, non-confined non-restricted surface of another material.

A material that is in the relaxed-with-defects condition is a material that contains visible defects that are indicative that the material has relaxed to the point where defects have been formed in the material. For example, FIG. 1C is a TEM photograph of a cross-sectioned fin of a FinFET device (taken along the axial length "L" of the fin) wherein the substrate fin C1 is comprised of silicon and the alternative fin material portion C2 of the fin is comprised of silicon-germanium with a 50% concentration of germanium ($SiGe_{0.5}$). The axial length direction "L" and height direction "H" of the fin are indicated in FIG. 1C. In this example, the thickness or height "H" of the alternative fin material C2 was about 30 nm, a thickness greater than the metastable critical thickness for this material (which is about 30 nm according to FIG. 1B). Accordingly, the alternative fin material C2 is in the relaxed-with-defects condition and defects are visible throughout the alternative fin material C2 and at the interface between the materials C1/C2. Thus, in this example, the alternative fin material C2 shown in FIG. 1C is fully relaxed in all three directions—axial length L, height H and width W, i.e., it is in the relaxed-with-defects condition.

As another example, a substantially pure layer of germanium (Ge concentration equal to 1.0) may have a maximum stable critical thickness of about 1-2 nm when formed on a silicon substrate, i.e., in an unconfined growth environment. A substantially pure layer of germanium formed to a thickness of 1-2 nm or less would be considered to be a stable, fully-strained layer of germanium. In contrast, a layer of silicon-germanium with a concentration of germanium of about fifty percent ($SiGe_{0.5}$) may have a maximum stable critical thickness of about 4 nm and still be substantially free of defects, i.e., in a stable condition. However, such a layer of germanium or silicon-germanium would no longer be considered to be a stable material if grown beyond their respective maximum stable critical thickness values. When such a layer of material is grown to a thickness that is greater than its maximum stable critical thickness but less than its maximum metastable thickness, it is considered to be a metastable material that, when heated for example, would start experiencing some degree of relaxation, i.e., there will be some degree of strain relaxation along one or more of the crystalline planes of the material and there may or may not be some defects present at or near the interface between the alternative fin material and the substrate fin. Thus, in general, the formation of stable, fully-strained, substantially defect-free alternative materials on silicon is limited to very thin layers of the alternative materials.

The presence of defects in an alternative-material fin structure would be detrimental to device operations. One process that has been investigated for use in forming such alternative fin materials is known as aspect-ratio-trapping (ART). Some basic aspects of the ART process will now be discussed with reference to FIGS. 1D-1H. FIG. 1D is a cross-sectional view (in the gate width direction (W)) of an illustrative FinFET device 10 after several process operations were performed. First, one or more etching processes, e.g., anisotropic etching processes, were performed through a patterned etch mask (not shown) to define a plurality of fin-formation trenches 12X in the substrate 12. The formation of the trenches 12X results in the formation of a plurality of initial fin structures 16. Thereafter, a layer of insulating material 14, such as a layer of silicon dioxide, was formed in the trenches 12X between the fins 16. The layer of insulating material 14 was blanket-deposited across the device so as to over-fill the trenches 12X. Thereafter, a chemical mechanical polishing (CMP) process was performed to planarize the upper surface 14U of the layer of material 14 with the upper surface 16U of the fins 16.

Next, as shown in FIG. 1E, one or more etching processes were performed to remove substantially all or part of the fins 16 and thereby expose a surface 12S of the substrate 12. This process defines a plurality of trenches 14T in the layer of insulating material 14.

Next, as shown in FIG. 1F, a strain-relaxed buffer (SRB) material 18, e.g., silicon-germanium, was initially formed in the trenches 14T, typically so as to overfill the trenches 14T. Thereafter, a CMP/etch-back process was performed on SRB material 18 so as to leave only the desired amount of the SRB material 18 in the trenches 14T. At that point, an anneal process was performed on the device 10. The anneal process results in the formation of simplistically depicted faults 20 in the SRB material 18. FIG. 1F is a cross-sectional view of the device 10 in the gate width (W) direction of the device, while FIG. 1G is a cross-sectional view taken through one of the fins 16 in a gate length, current-transport direction (L) of the device 10.

In the ART process, the trench 14T is made deep enough (e.g., an aspect ratio of at least 2, but it may be much larger, in order for the ART process to work) such that defects 20 generated in the material grown within the trench 14T, in this case the SRB material 18, will be trapped at or near the bottom of the original trench 14T and in the sidewalls of the trench 14T positioned slightly above the interface between the substrate material 12 and the SRB material 18. The amount of defects 20 generated and the propagation of such defects 20 will depend upon the crystal orientation of the substrate 12. The intent of the ART process is that, while defect-containing material is present at or near the bottom of the trench 14T, the uppermost portions of the SRB material 18 will be substantially defect-free, as shown in FIG. 1F. However, as it relates to the specific task of forming fin structures for a FinFET device, the ART process has significant drawbacks due to the three-dimensional nature of the fin structures. The ART process works fairly well in trapping the defects 20 that propagate in the gate width direction W—see FIG. 1F—wherein the defects 20 engage the sidewalls 14S of the trench 14T. However, as shown in FIG. 1G, defects 20 that propagate in the gate length direction L can and do propagate all the way to the upper surface 18S of the SRB material 18, because in the middle regions of trench 14T there is no sidewall to stop the propagation of the defects 20 in the gate length direction.

FIG. 1H depicts the device 10 after the channel semiconductor material 22, e.g., silicon-germanium, silicon, or germanium, is grown on the defect-containing SRB material 18. Ideally, the channel semiconductor material 22 will be as defect-free as possible. However, due to the propagation of the defects 20 in the gate length directions, and the presence of those defects 20 at the surface 18S of the SRB material 18, the defects 20 may continue to propagate into the channel semiconductor material 22, as reflected by the dashed lines 20A in FIG. 1H. As a result, the channel semiconductor material 22 may contain more defects than would otherwise be desirable, and the presence of such defects in the channel semiconductor material 22 may reduce or limit the performance capability of the FinFET device 10.

The present disclosure is directed to various methods of forming alternative material fins with reduced defect density for a FinFET semiconductor device that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming alternative material fins with reduced defect density for a FinFET semiconductor device. One illustrative method disclosed herein includes, among other things, forming a plurality of trenches in a semiconductor substrate to thereby define a fin having an upper surface, forming a layer of insulating material in the trenches such that the upper surface of the fin is exposed, performing at least one etching process to remove at least a portion of the fin and thereby define a fin trench in the layer of insulating material, forming a first layer of semiconductor material in the fin trench, the first layer of semiconductor material having an upper surface that is positioned below an upper surface of the layer of insulating material, forming a second layer of semiconductor material in the fin trench on the upper surface of the first layer of semiconductor material, the second layer of semiconductor material having an upper surface that is positioned below the upper surface of the layer of insulating material, after forming the second layer of semiconductor material, performing an anneal process to induce defect formation in at least the first layer of semiconductor material, wherein, after the anneal process is performed, the upper surface of the second layer of semiconductor material is substantially defect-free, forming a layer of channel semiconductor material on the upper surface of the second layer of semiconductor material and forming a gate structure around at least a portion of the channel semiconductor material.

Another illustrative method disclosed herein includes, among other things, forming a plurality of trenches in a semiconductor substrate to thereby define a fin having an upper surface, forming a layer of insulating material in the trenches such that the upper surface of the fin is exposed, performing at least one etching process to remove at least a portion of the fin and thereby define a fin trench in the layer of insulating material, forming a first layer of silicon-germanium semiconductor material in the fin trench, the first layer of semiconductor material having an upper surface that is positioned below an upper surface of the layer of insulating material, wherein the first layer of semiconductor material has a varying concentration of germanium throughout its thickness, the concentration of germanium being higher at the bottom surface of the first layer of semiconductor material than it is at the upper surface of the first layer of semiconductor material, forming a second layer of semiconductor material in the fin trench on the upper surface of the first layer of semiconductor material, the second layer of semiconductor material having an upper surface that is positioned below the upper surface of the layer of insulating material, after forming the second layer of semiconductor material, performing an anneal process to induce defect formation in at least the first layer of semiconductor material, wherein, after the anneal process is performed, the upper surface of the second layer of semiconductor material is substantially defect-free, forming a layer of channel semiconductor material on the upper surface of the second layer of semiconductor material and forming a gate structure around at least a portion of the channel semiconductor material.

Yet another illustrative method disclosed herein includes, among other things, forming a plurality of trenches in a semiconductor substrate to thereby define a fin having an upper surface, forming a layer of insulating material in the trenches such that the upper surface of the fin is exposed, performing at least one etching process to remove at least a portion of the fin and thereby define a fin trench in the layer of insulating material, forming at least one layer of a carbon-containing semiconductor material in the fin trench, the at least one layer of a carbon-containing semiconductor material having an upper surface that is positioned below an upper surface of the layer of insulating material, forming at least one first layer of silicon-germanium on the upper surface of the at least one layer of a carbon-containing semiconductor material, the at least one first layer of silicon-germanium having an upper surface that is positioned below the upper surface of the layer of insulating material, forming a second layer of silicon-germanium in the fin trench above the upper surface of the at least one layer of silicon-germanium, the second layer of silicon-germanium having an upper surface that is positioned below the upper surface of the layer of insulating material, after forming the second layer of silicon-germanium, performing an anneal process to induce defect formation in the at least one layer of a carbon-containing semiconductor material, wherein, after the anneal process is performed, the upper surface of the second layer of silicon-germanium is substantially defect-free, forming a layer of channel semiconductor material on the upper surface of the second layer of silicon germanium, and forming a gate structure around at least a portion of the channel semiconductor material.

Yet another illustrative method disclosed herein includes, among other things, forming a plurality of trenches in a semiconductor substrate to thereby define a fin having an upper surface, forming a layer of insulating material in the trenches such that the upper surface of the fin is exposed, performing at least one etching process to remove at least a portion of the fin and thereby define a fin trench in the layer of insulating material, forming a first layer of semiconductor material in the fin trench, the first layer of semiconductor material having an upper surface that is positioned below an upper surface of the layer of insulating material, forming a second layer of semiconductor material in the fin trench on the upper surface of the first layer of semiconductor material, the second layer of semiconductor material having an upper surface that is positioned below the upper surface of the layer of insulating material, forming a third layer of semiconductor material in the fin trench on the upper surface of the second layer of semiconductor material, the third layer of semiconductor material having an upper surface that is positioned below the upper surface of the layer of insulating material, after forming either the second or third layers of semiconductor material, performing an anneal process to induce defect formation in the first layer of semiconductor material, wherein, after the anneal process is performed, the upper surface of the second layer of silicon-germanium is substantially defect-free, forming a layer of channel semiconductor material on the upper surface of the third layer of semiconductor material and forming a gate structure around at least a portion of the channel semiconductor material.

BRIEF DESCRIPTION OF THE DRAWINGS

The disclosure may be understood by reference to the following description taken in conjunction with the accompanying drawings, in which like reference numerals identify like elements, and in which.

Figure 1A:
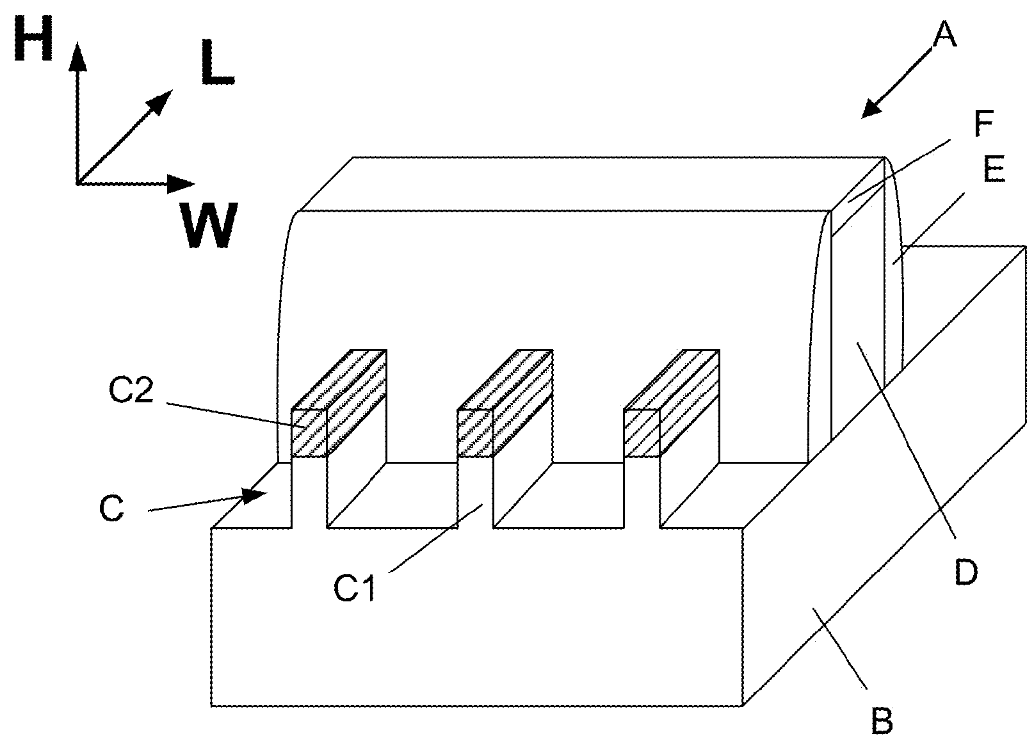
FIGS. 1A-1C depict examples of prior art FinFET devices wherein the fins for the device are comprised of an alternative fin material formed above a substrate fin.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming alternative material fins with reduced defect density for a FinFET semiconductor device. The methods disclosed herein may be employed in manufacturing either an N-type device or a P-type device, and the gate structure of such devices may be formed using either so-called "gate-first" or "replacement gate" ("gate-last" or "gate-metal-last") techniques. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail. Additionally, as used herein and in the attached claims, reference will be made to layers of material that contain "defects," performing activities that generate "defects," and/or forming layers of material that are "substantially free of defects." The "defects" mentioned in such phrases used herein shall be understood to be threading dislocations defects.

In the attached drawings, the device 100 is depicted as being formed above a semiconductor substrate 102 comprised of a semiconductor material, such as, for example, a bulk silicon substrate. Thus, the terms "substrate," "semiconductor substrate" or "semiconducting substrate" should be understood to cover all semiconductor materials. An isolation material (not shown) may be formed in the substrate 102 to define illustrative spaced-apart active regions in the substrate 102. The isolation regions may be formed using traditional techniques, e.g., traditional shallow trench isolation regions may be formed in the substrate 102. In the case of the illustrative FinFET devices disclosed herein, the isolation regions may be formed before or after the formation of the fin structures that will be formed as described more fully below.

Figure 2A:
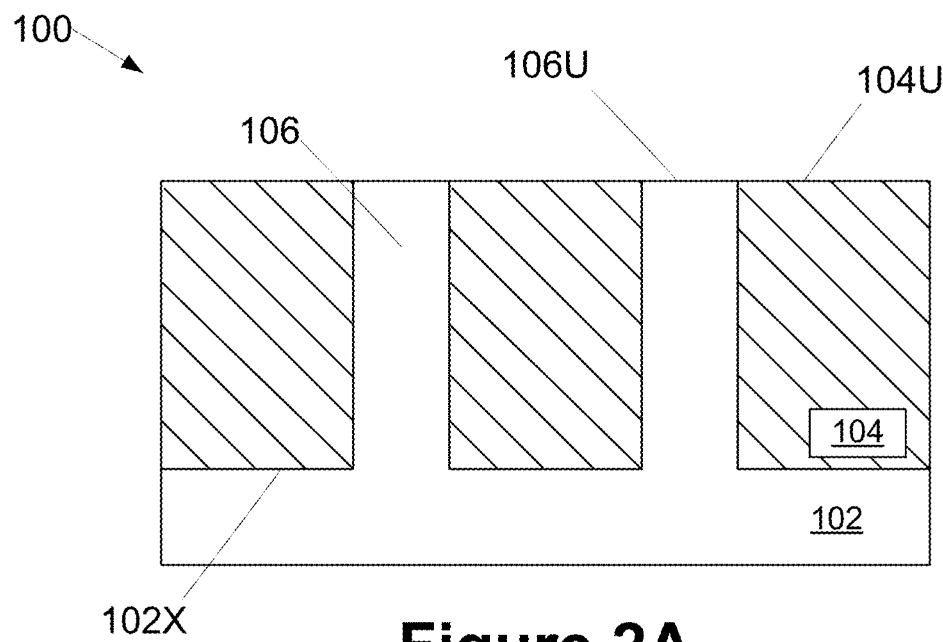
FIGS. 2A-2N depict various illustrative novel methods disclosed herein for forming alternative material fins with reduced defect density for a FinFET semiconductor device.

The alternative material fins disclosed herein may be formed using a variety of techniques. FIGS. 2A-2N depict various illustrative novel methods disclosed herein for forming alternative material fins with reduced defect density for a FinFET semiconductor device. FIG. 2A depicts the device 100 after several process operations were performed. First, one or more etching processes, e.g., anisotropic etching processes, were performed through a patterned etch mask (not shown) to define a plurality of fin-formation trenches 102X in the substrate 102. The formation of the trenches 102X results in the formation of a plurality of initial substrate fin structures 106. Thereafter, a layer of insulating material 104, such as a layer of silicon dioxide, was formed in the trenches 102X between the substrate fins 106. In one illustrative embodiment, the layer of insulating material 104 was blanket-deposited so as to over-fill the trenches 102X, and a chemical mechanical polishing (CMP) process was performed to planarize the upper surface 104U of the layer of material 104 with the upper surface 106U of the substrate fins 106. The layer of material 104 may be comprised of a variety of different materials, such as silicon dioxide, etc., and it may be formed by performing a variety of techniques, e.g., chemical vapor deposition (CVD), etc.

The width and height of the substrate fin structures 106 may vary depending upon the particular application. However, for the ART (aspect ratio trapping) technique to work, the fin structure needs to have an aspect ratio of at least 2 (but it could be much higher in order to make the film grow in a relaxed condition). Additionally, the overall size, shape and configuration of the fin-formation trenches 102X and substrate fins 106 may vary depending on the particular application. In one illustrative embodiment, based on current day technology, the depth of the trenches 102X may range from approximately 30-150 nm and the width of the trenches 102X may be about 20 nm or less. In some embodiments, the substrate fins 106 may have a final width within the range of about 7-20 nm. As will be appreciated by those skilled in the art after a complete reading of the present application, in some embodiments disclosed herein, the overall height of the substrate fins 106 may be about 100 nm. Of course, the above numbers are provided by way of example, and the formation of substrate fins 106 is not required to practice at least some of the several inventions disclosed herein.

In the illustrative examples depicted in the attached drawings, the fin-formation trenches 102X and substrate fins 106 are all depicted as having a uniform size and shape. However, such uniformity in the size and shape of the fin-formation trenches 102X and the substrate fins 106 is not required to practice at least some aspects of the inventions disclosed herein. In the attached figures, the fin-formation trenches 102X are depicted as having been formed by performing an anisotropic etching process that results in the fin-formation trenches 102X having a schematically depicted, generally rectangular configuration. In an actual real-world device, the sidewalls of the fin-formation trenches 102X may be somewhat inwardly tapered, although that configuration is not depicted in the attached drawings. In some cases, the fin-formation trenches 102X may have a reentrant profile (not shown) near the bottom of the fin-formation trenches 102X. To the extent the fin-formation trenches 102X are formed by performing a wet etching process, the fin-formation trenches 102X may tend to have a more rounded configuration or non-linear configuration as compared to the generally rectangular configuration of the fin-formation trenches 102X that are formed by performing an anisotropic etching process. Thus, the size and configuration of the fin-formation trenches 102X, and the manner in which they are made, as well as the general configuration of the substrate fins 106, should not be considered a limitation of the present invention. For ease of disclosure, only the substantially rectangular fin-formation trenches 102X and substrate fins 106 will be depicted in the subsequent drawings. Moreover, the device 100 may be formed with any desired number of substrate fins 106.

Figure 2B:
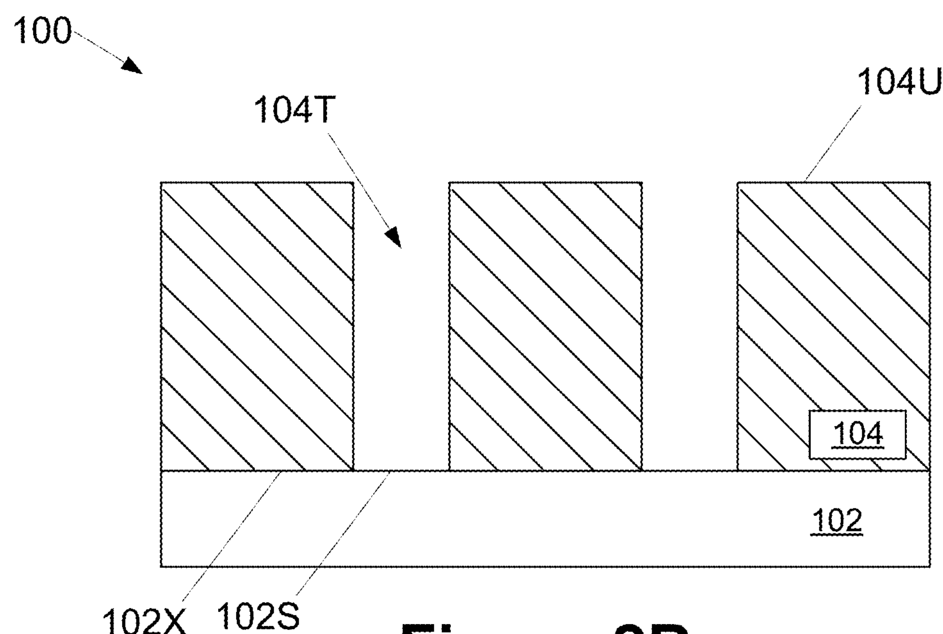

Next, as shown in FIG. 2B, one or more etching processes were performed to remove at least a portion of the substrate fins 106, i.e., to remove substantially all or a part of the fins 106. In the depicted example, substantially all of the substrate fins 106 were removed so as to thereby expose a surface 102S of the substrate 102. This process defines a plurality of fin trenches 104T in the layer of insulating material 104. Again, as noted above, the fin trenches 104T should have an aspect of at least 2 in order for the ART process to work. As noted above, in some applications, less than all of the substrate fin 106 material may be removed when forming the fin trenches 104T. Even in that latter application, i.e., where some of the fin remains, portions of the substrate 102 are exposed since the fins 106 are made of the substrate material.

Figure 2C:
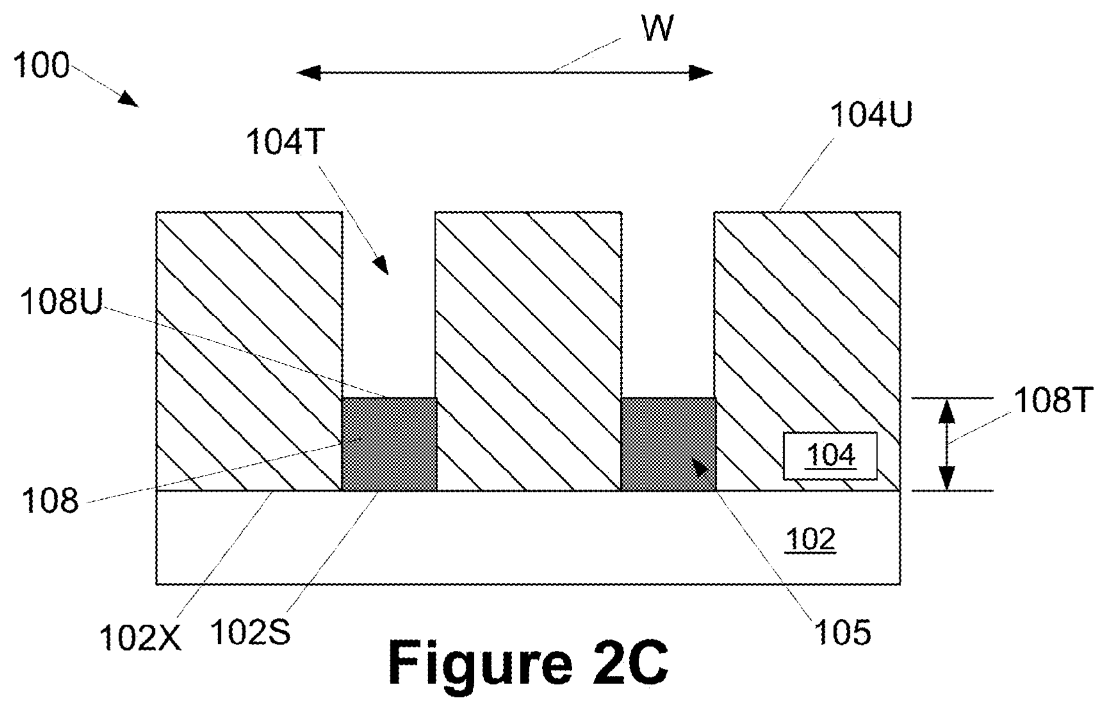
Figure 2D:
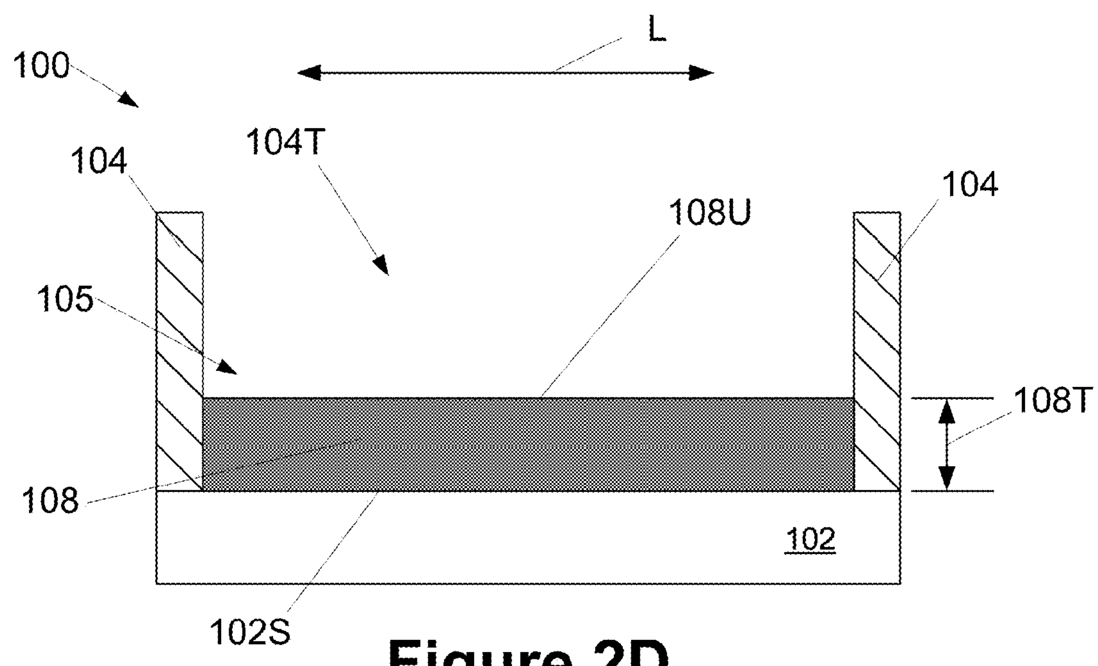

FIG. 2C is a cross-sectional view of the device 100 in the gate width (W) direction of the device 100, while FIG. 2D is a cross-sectional view taken through one of the substrate fins 106 in a gate length, current-transport direction (L) of the device 100. As shown in FIGS. 2C-2D, the next process operation involves the formation of a first layer of semiconductor material of a multi-layered, hetero-structured, strain-relaxation buffer structure 105 (Hetero-SRB structure 105) in the fin trenches 104T. As used herein and in the attached claims, the term "hetero-structured, strain-relaxation structure" means a structure comprised of compositionally different material layers instead of a homogeneous layer of material. More specifically, FIGS. 2C-2D depict the device 100 after the formation of a first layer of semiconductor material 108 of one embodiment of the Hetero-SRB structure 105 disclosed herein. Typically, this first layer of semiconductor material 108 of the Hetero-SRB structure 105 is formed of a material and to a thickness such that defects may be more easily generated in the first layer of semiconductor material 108 as compared to a later layer to be formed above the first layer of semiconductor material 108 of the Hetero-SRB structure 105. The structure depicted in FIGS. 2C-2D may be formed as follows. First, the first layer of semiconductor material 108 may be epitaxially grown in the fin trenches 104T, typically so as to overfill the fin trenches 104T. Thereafter, a CMP/etch-back process was performed on the first layer of semiconductor material 108 so as to leave only the desired amount 108T of the first layer of semiconductor material 108 in the fin trenches 104T. The first layer of semiconductor material 108 has an upper surface 108U that is positioned below the upper surface 104U of the layer of insulating material 104.

Figure 2E:
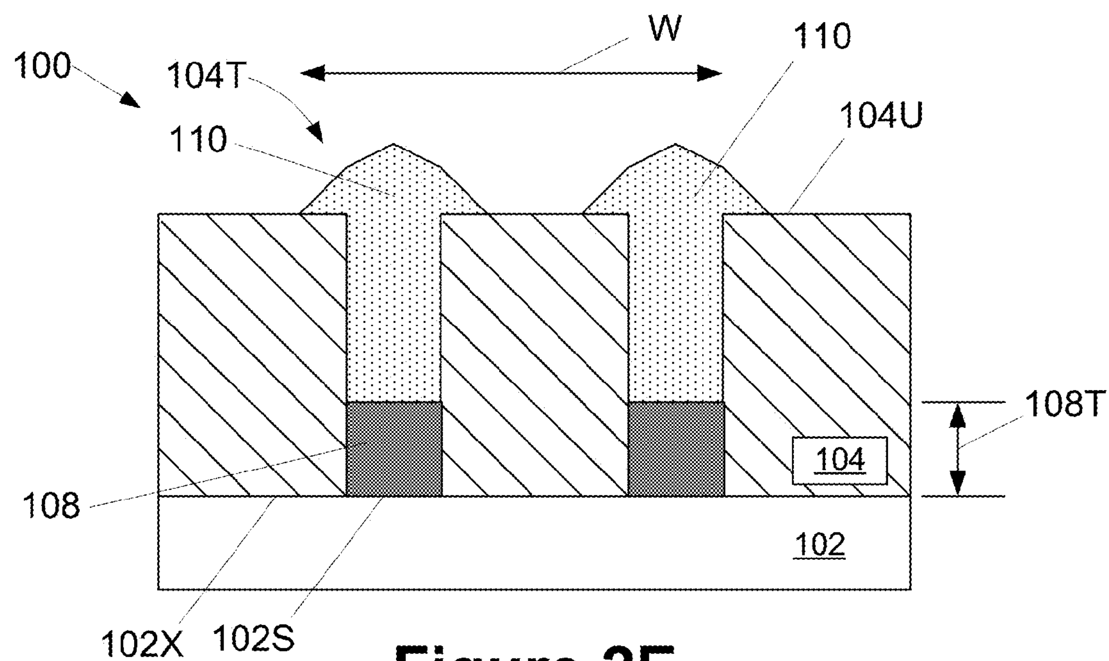
Figure 2F:
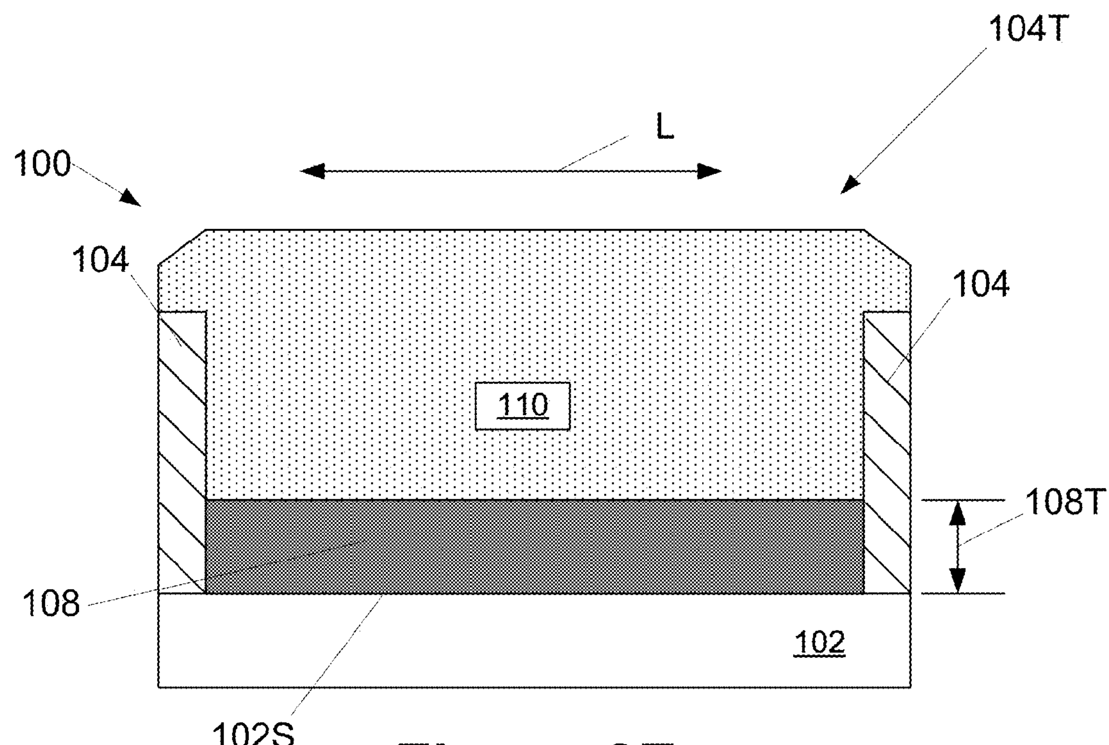

FIG. 2E is a cross-sectional view of the device 100 in the gate width (W) direction, while FIG. 2F is a cross-sectional view taken through one of the substrate fins 106 in a gate length, current-transport direction (L) of the device 100. As shown in FIGS. 2E-2F, the next process operation involves the formation of a second layer of semiconductor material 110 of the Hetero-SRB structure 105. The second layer of semiconductor material 110 is formed by performing an epitaxial growth process, wherein the first layer of semiconductor material 108 serves as the seed layer during the formation of the second layer of semiconductor material 110. At this point in the process flow, the second layer of semiconductor material 110 is formed so as to overflow the fin trenches 104T.

Figure 2G:
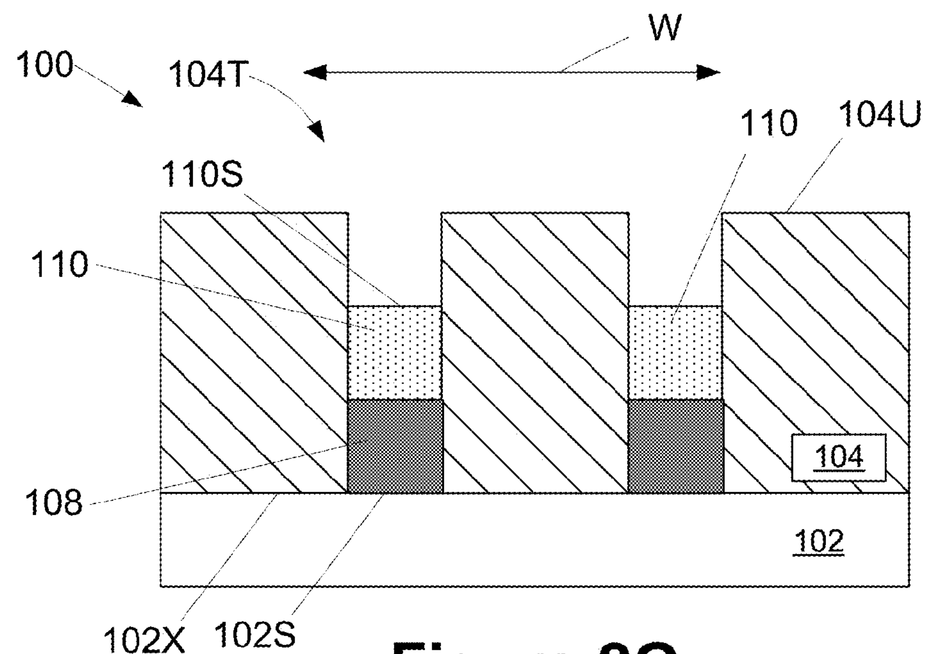
Figure 2H:
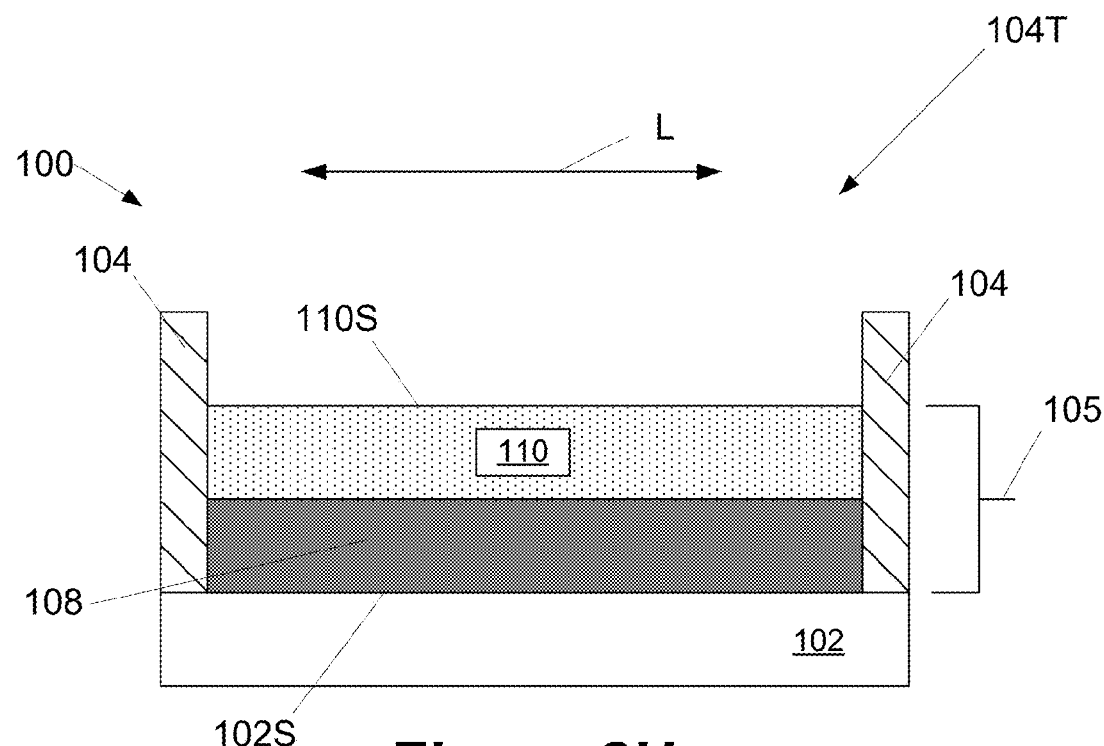

FIG. 2G is a cross-sectional view of the device 100 in the gate width (W) direction, while FIG. 2H is a cross-sectional view taken through one of the substrate fins 106 in a gate length, current-transport direction (L) of the device 100. As shown in FIGS. 2G-2H, CMP/etch-back process operations were performed so as to recess the upper surface 110S of the second layer of semiconductor material 110 to the desired level in the fin trenches 104T. The second layer of semiconductor material 110 has an upper surface 110S that is positioned below the upper surface 104U of the layer of insulating material 104. These process operations result in the formation of the illustrative example of a Hetero-SRB structure 105 comprised of the first layer of semiconductor material 108 and the second layer of semiconductor material 110. Of course, if desired, the Hetero-SRB structure 105 may be comprised of more than the two illustrative layers 108, 110 depicted herein, as described more fully below.

Figure 2I:
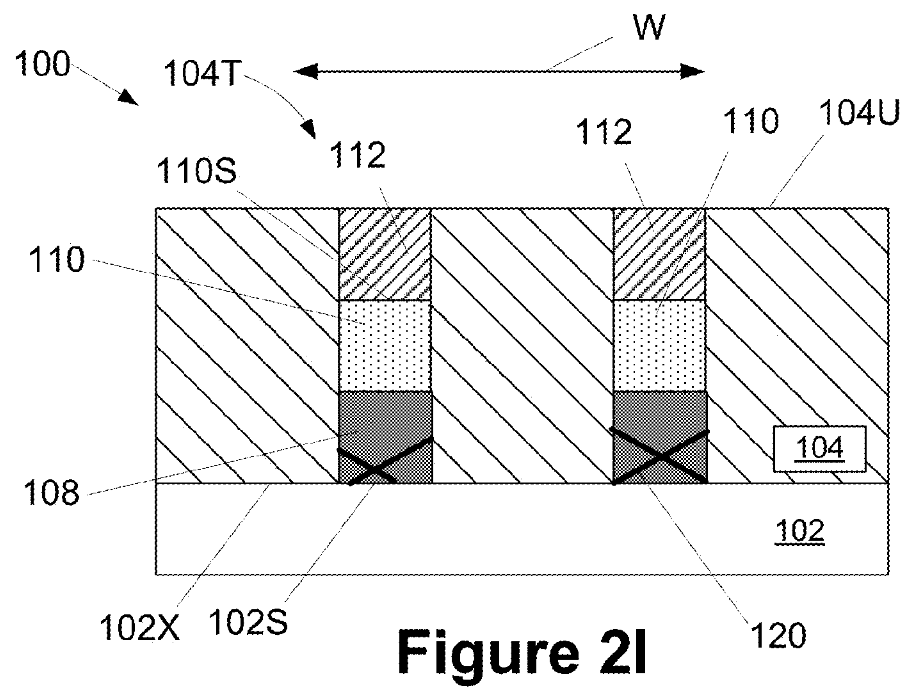
Figure 2J:
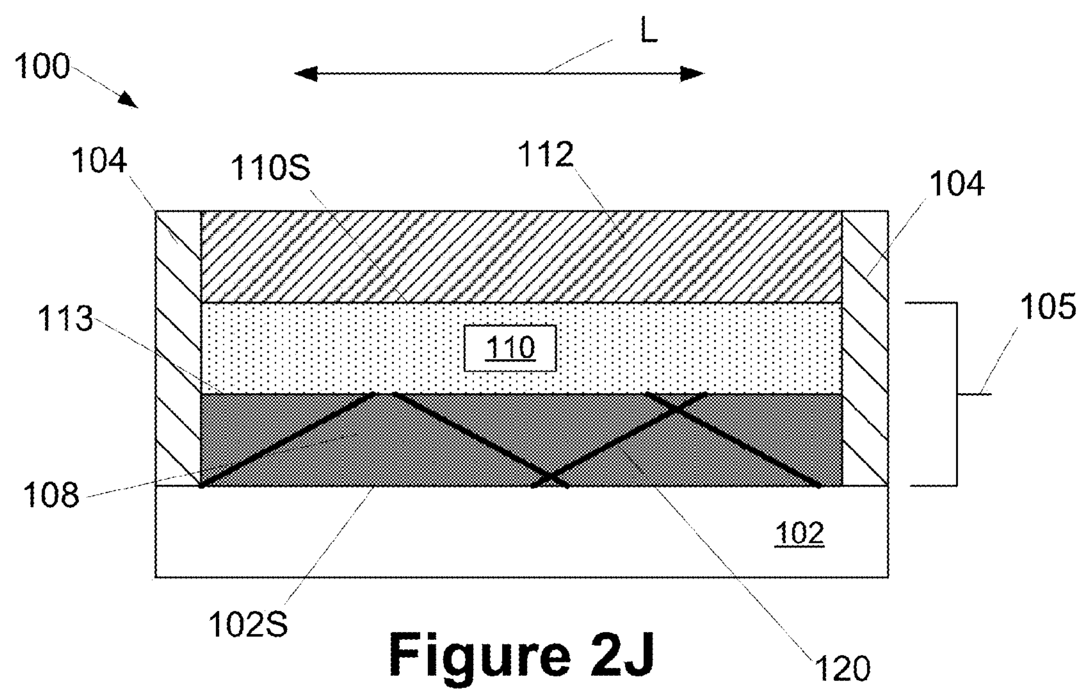

FIG. 2I is a cross-sectional view of the device 100 in the gate width (W) direction, while FIG. 2J is a cross-sectional view taken through one of the substrate fins 106 in a gate length, current-transport direction (L) of the device 100. FIGS. 2I-2J depict the device 100 after several process operations were performed. First, an anneal process was performed on the device 100 at a temperature that falls within the range of about 700-1100° C. The anneal process results in the formation of illustrative and simplistically depicted defects 120 in the first layer of semiconductor material 108 of the Hetero-SRB structure 105. With reference to FIG. 2I, the sidewalls of the fin trench 104T stop the propagation of the defects 120 in the gate width (W) direction. With reference to FIG. 2J, unlike the prior art methods discussed in the background section of this application, due to the presence of the second layer of semiconductor material 110, the propagation of the defects 120 in the gate length (L) direction of the device 100 are stopped at the interface 113 between the first layer of semiconductor material 108 and the second layer of semiconductor material 110. As a result, few, if any, of the defects 120 propagate into the second layer of semiconductor material 110, and very few, if any, of the defects 120 will propagate to the upper surface 110S of the second layer of semiconductor material 110. Accordingly, the upper surface 110S of the uppermost surface of the Hetero-SRB structure 105, i.e., in this case, the upper surface of the second layer of semiconductor material 110, is substantially free of the defects 120. As used herein and in the claims, when it is stated that a surface of a layer of material is "substantially free of defects" or "substantially defect-free," it means that that there are less than $1e^5$ defects/$cm^2$ at the subject surface. Additionally, as used herein and in the claims, when it is stated that a layer of material is "substantially free of defects" or "substantially defect-free," it means that that the layer of material has a defect density of less than $1e^5$ defects/$cm^3$.

With continuing reference to FIGS. 2I-2J, the next process operation involves the formation of a channel semiconductor 112 above the uppermost surface 110S of the Hetero-SRB structure 105. The channel semiconductor material 112 may be made of different materials depending upon the type of device (P or N) under construction. For example, in the case of a P-type FinFET device 100, the channel semiconductor material 112 may be made of a material such as silicon-germanium, e.g., $SiGe_{0.5}$. In the case of an N-type FinFET device 100, the channel semiconductor material 112 may be made of a material such as silicon. The channel semiconductor material 112 depicted in FIGS. 2I-2J may be formed as follows. First, the channel semiconductor material 112 may be epitaxially grown in the fin trenches 104T using the upper surface 110S of the Hetero-SRB structure 105 as the seed layer. Typically, the channel semiconductor material 112 will be initially formed so as to overfill the fin trenches 104T. Thereafter, a CMP process may be performed so as to remove excess amounts of the channel semiconductor material 112 positioned above the layer of insulating material 104 outside of the fin trenches 104T.

Figure 2K:
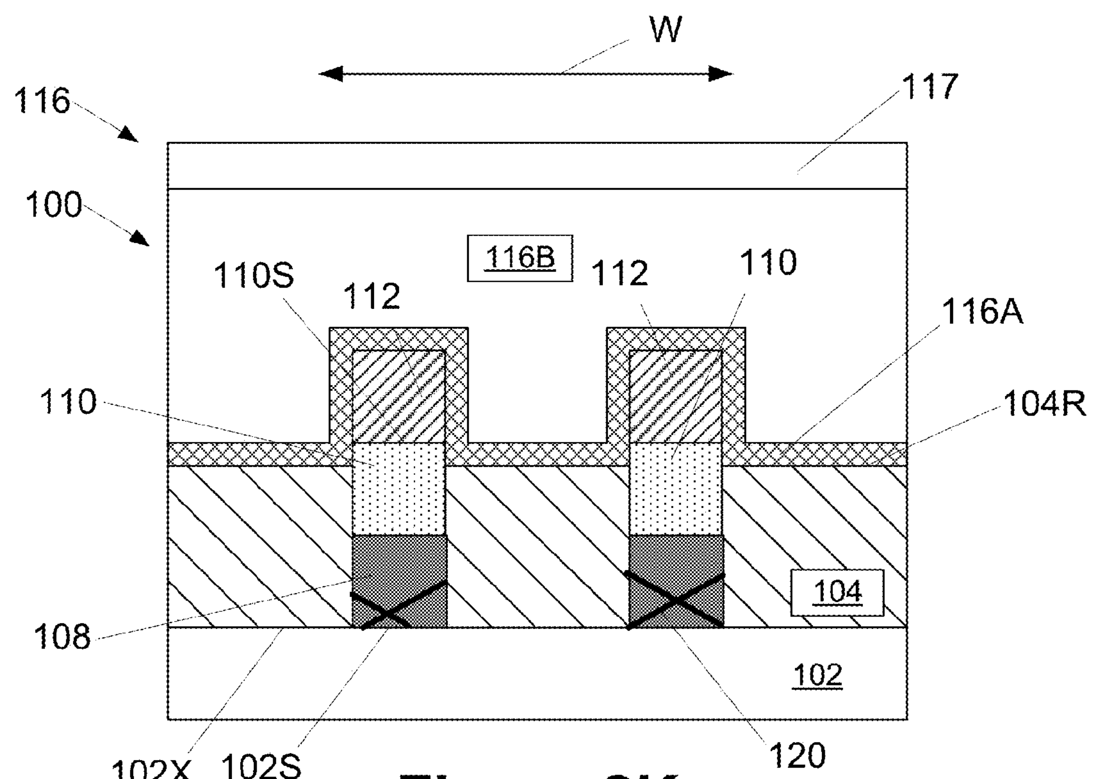
Figure 2L:
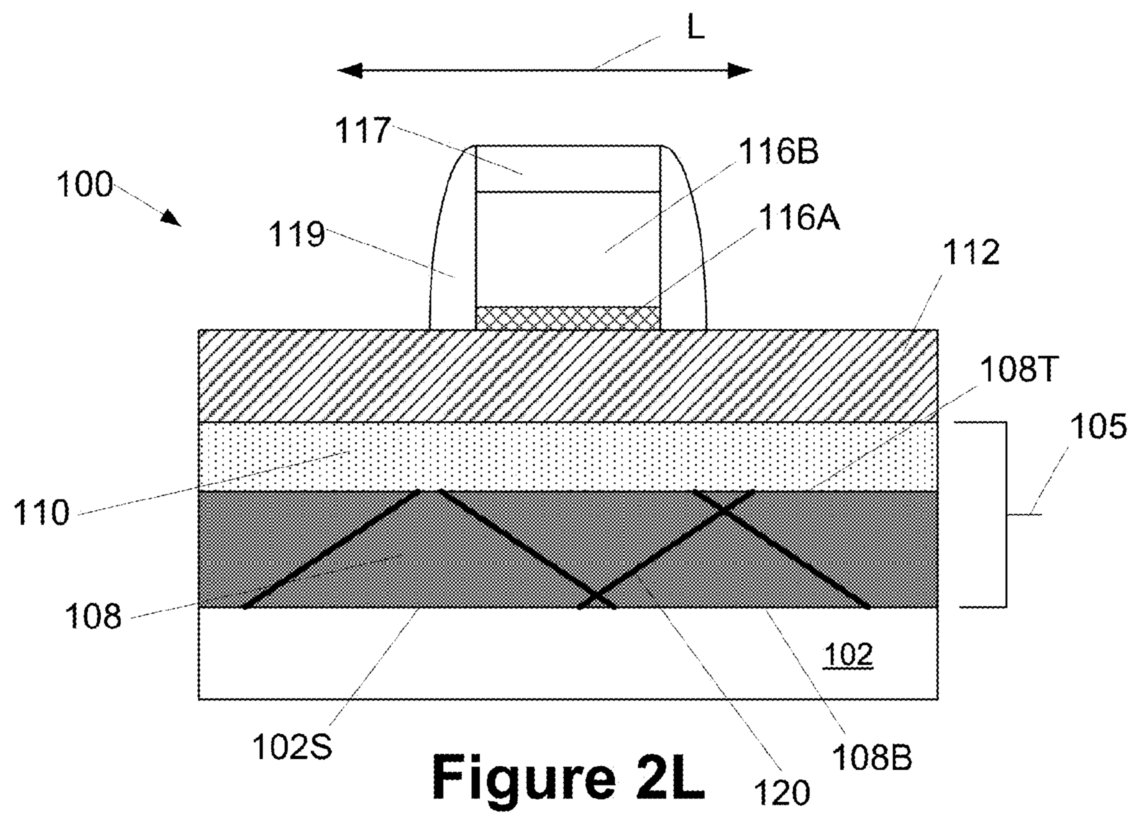

At the point of processing depicted in FIGS. 2I-2J, the illustrative FinFET device 100 may be completed using traditional fabrication techniques. For example, FIGS. 2K-2L depict the device 100 after the layer of insulating material 104 was recessed so as to expose the desired amount of the channel semiconductor material 112 and perhaps a portion of the second layer of semiconductor material 110. Thereafter, an illustrative gate structure 116, a gate cap layer 117 and sidewalls spacers 119 were formed for the device 100. In one illustrative embodiment, the schematically depicted gate structure 116 includes an illustrative gate insulation layer 116A and an illustrative gate electrode 116B. The gate insulation layer 116A may be comprised of a variety of different materials, such as, for example, silicon dioxide, a so-called high-k (k greater than 10) insulation material (where k is the relative dielectric constant), etc. Similarly, the gate electrode 116B may also be of a material such as polysilicon or amorphous silicon, or it may be comprised of one or more metal layers that act as the gate electrode 116B. As will be recognized by those skilled in the art after a complete reading of the present application, the gate structure 116 of the device 100 depicted in the drawings, i.e., the gate insulation layer 116A and the gate electrode 116B, is intended to be representative in nature. That is, the gate structure 116 may be comprised of a variety of different materials and it may have a variety of configurations, and the gate structure 116 may be made using either the so-called "gate-first" or "replacement gate" techniques. In one illustrative embodiment, an oxidation process or a conformal deposition process may be performed to form a gate insulation layer 116A comprised of a material such as, for example, silicon dioxide, silicon nitride, hafnium oxide, a high-k (k value greater than 10) insulating material, etc. Thereafter, the gate electrode material 116B and the layer of material for the gate cap 117 may be deposited above the device 100 and the layers may be patterned using known photolithographic and etching techniques and planarized by known CMP techniques. Thereafter, using traditional techniques, the sidewall spacers 119 may be formed proximate the gate structure 116 by blanket-depositing a layer of spacer material and thereafter performing an anisotropic etching process to define the spacers.

The Hetero-SRB structure 105 disclosed herein may be in different forms. For example, in one illustrative embodiment, the first layer of semiconductor material 108 of the Hetero-SRB structure 105 may be a layer of silicon-germanium with a first substantially uniform germanium concentration, while the second layer of semiconductor material 110 of the Hetero-SRB structure 105 may be a layer of silicon-germanium with a second substantially uniform germanium concentration that is different than the first germanium concentration, wherein the values of the first and second germanium concentrations may vary depending upon the particular application. For example, the second concentration of germanium may be less than the first concentration of germanium. As noted above, the channel semiconductor material 112 may be comprised of a variety of different materials depending upon the device 100 under construction. For example, for a P-type FinFET device 100, the channel semiconductor material 112 may be a layer of $SiGe_{0.5}$. For an N-type FinFET device 100, the channel semiconductor material 112 may be silicon.

In one particular embodiment, the first layer of semiconductor material 108 may be a reversed graded layer of silicon-germanium wherein the germanium concentration at the interface 108B (see FIG. 2L) between the first layer of semiconductor material 108 and the substrate 102 is greater than the germanium concentration at the upper surface 108T of the first layer of semiconductor material 108. As an example, the germanium concentration at the surface 108B may be about 35%, whereas the germanium concentration at the upper surface 108T may be about 25%. In this particular example, the second layer of semiconductor material 110 of the Hetero-SRB structure 105 may be formed with a substantially uniform germanium concentration, e.g., about 25% germanium.

Figure 2M:
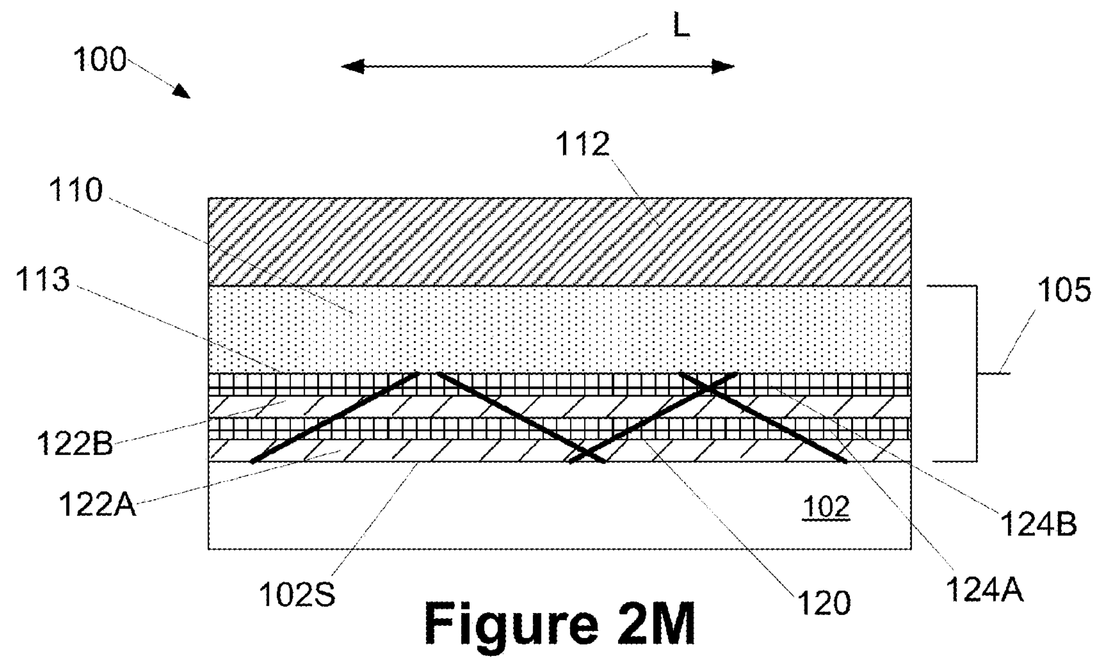
Figure 2N:
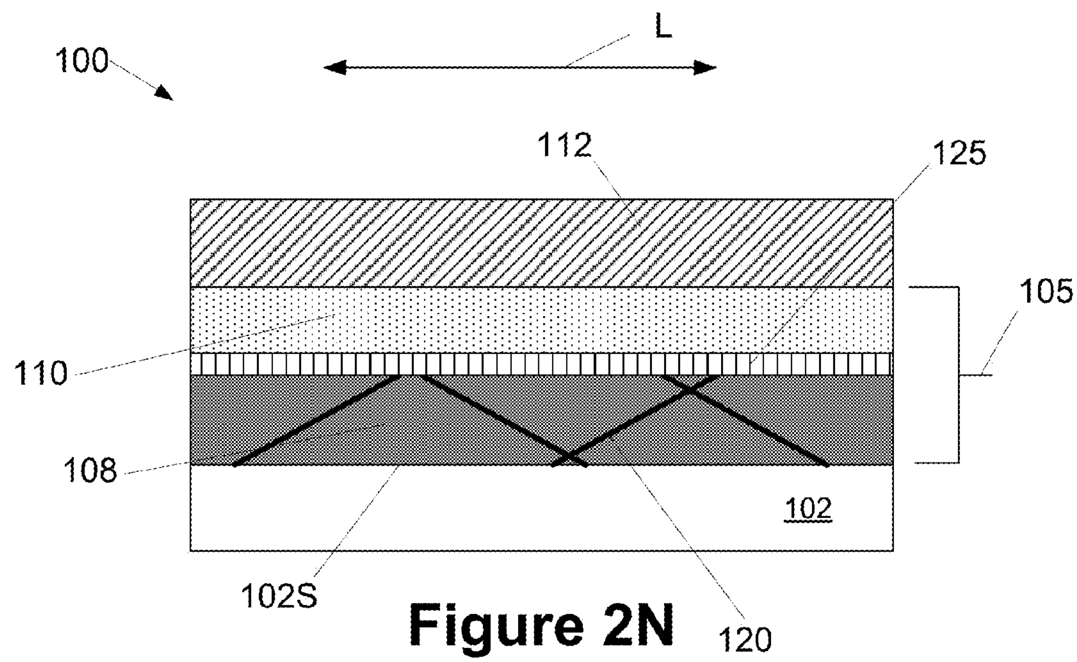

FIG. 2M depicts another illustrative embodiment of a Hetero-SRB structure 105 disclosed herein. In this example, the Hetero-SRB structure 105 is comprised of alternating and interleaved layers 122A, 122B of SiGeC and layers of SiGe 124A, 124B. In this application, the carbon in the layers 122A, 122B is not stable and, therefore, favors the formation of the simplistically depicted defects 120 within the lower portions of the Hetero-SRB structure 105. The number and thicknesses of the layers 122, 124 may vary depending upon the particular application. In this particular example, the second layer of semiconductor material 110 of the Hetero-SRB structure 105 may be formed with a substantially uniform germanium concentration, e.g., about 25% germanium. After formation of the above-described second layer of semiconductor material 110, the above-described anneal process is performed to form the simplistically depicted defects 120. Thereafter, the above-described channel semiconductor material 112 is formed on the second layer of semiconductor material 110.

FIG. 2N depicts another illustrative embodiment of a Hetero-SRB structure 105 disclosed herein. In this example, the first layer of semiconductor material 108 of the Hetero-SRB structure 105 may be comprised of a layer of silicon-germanium (SiGe) that is formed at a relatively low temperature, such as below 500° C., like 250-400° C. Formation of this material at such a relatively low temperature means that the material is relatively "weak," and that the defects 120 may be more easily formed in such a weakened material. In this particular example, the upper layer of semiconductor material 110 of the Hetero-SRB structure 105 may be formed with a substantially uniform germanium concentration, e.g., about 25% germanium, that is formed at traditional temperatures, e.g., 600-800° C. In this particular example, a relatively thin layer of silicon 125, e.g., 1-10 nm, may be formed on the first layer 108 of the Hetero-SRB structure 105 prior to the formation of the second layer of semiconductor material 110. After formation of the above-described layer of silicon 125 and/or the second layer of semiconductor material 110, the above-described anneal process is performed to form the simplistically depicted defects 120 in the first layer of semiconductor material 108. In the depicted example, the defects 120 do not propagate beyond the layer of silicon 125. Thereafter, the above-described channel semiconductor material 112 may be formed on the second layer of semiconductor material 110.

Figure 3A:
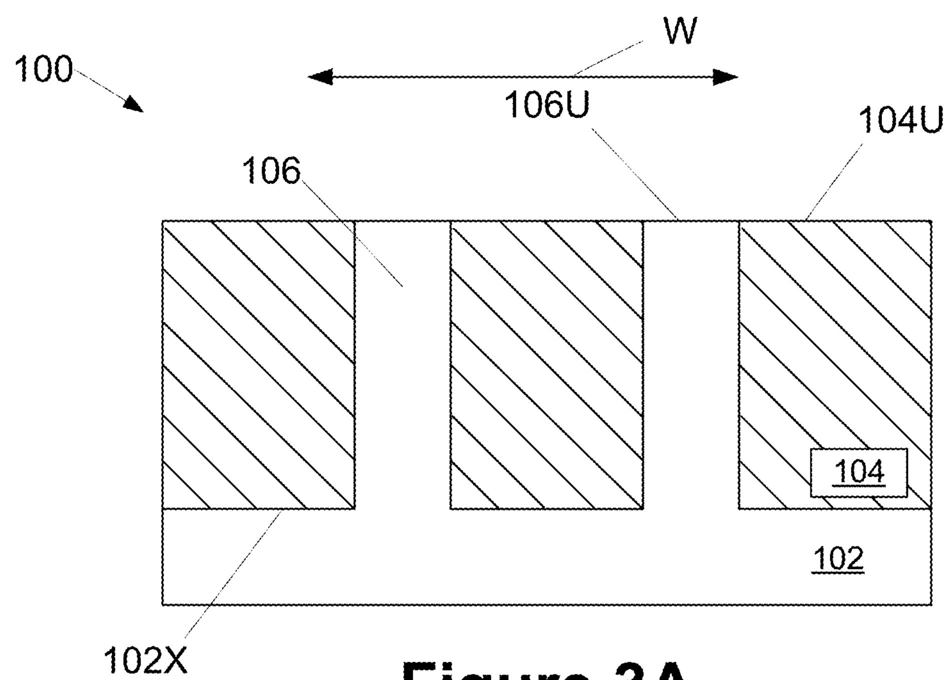
FIGS. 3A-3L depict yet other illustrative novel methods disclosed herein for forming alternative material fins with reduced defect density for a FinFET semiconductor device.

FIGS. 3A-3L depict yet other illustrative novel methods disclosed herein for forming alternative material fins with reduced defect density for a FinFET semiconductor device. FIG. 3A depicts the device 100 at a point in processing that corresponds to that depicted in FIG. 2A.

Figure 3B:
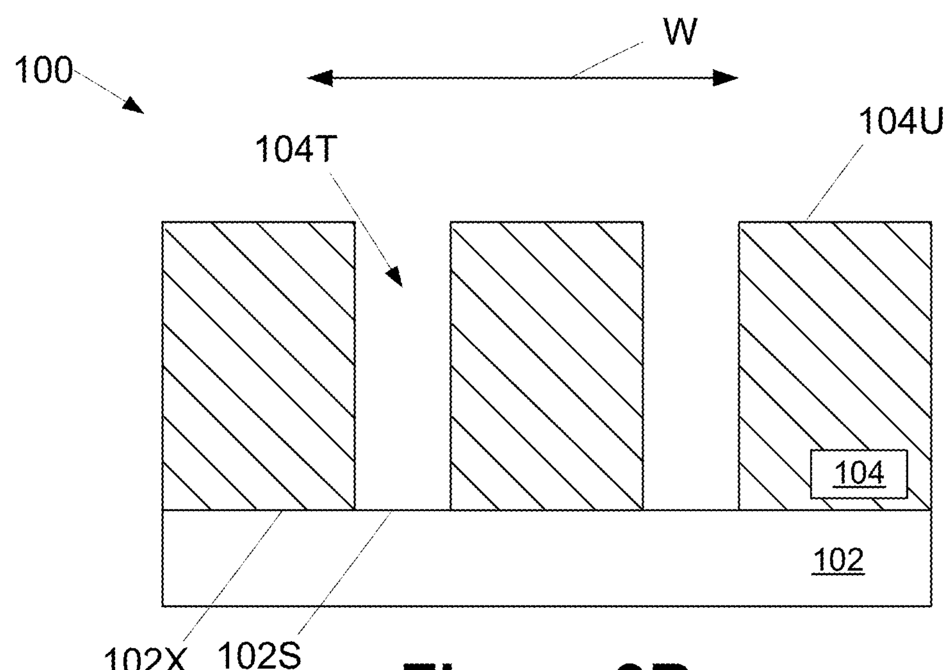

FIG. 3B depicts the device 100 at a point in fabrication that corresponds to that depicted in FIG. 2B, i.e., after one or more etching processes were performed to remove substantially all of the substrate fins 106 and thereby expose a surface 102S of the substrate 102. As before, this process defines a plurality of fin trenches 104T (with an aspect ratio greater than 2) in the layer of insulating material 104.

Figure 1B:
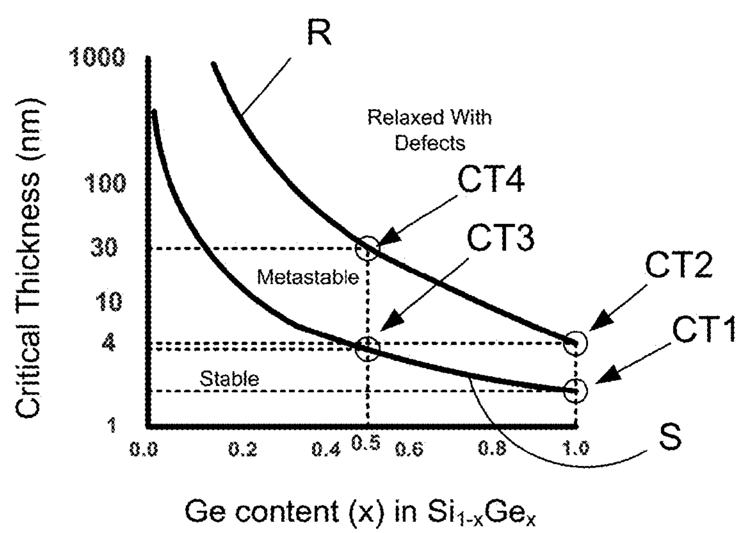
Figure 1C:
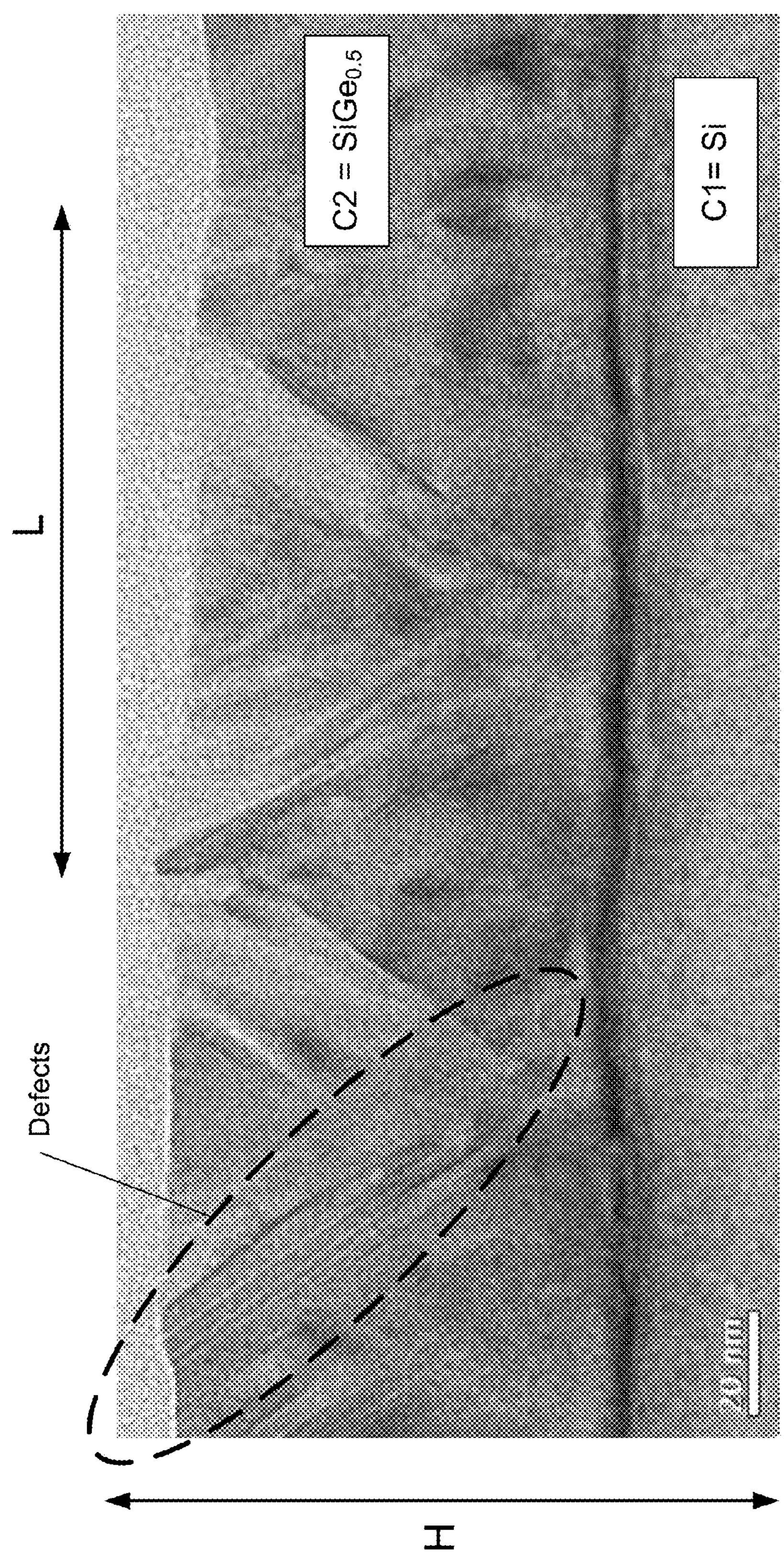
Figure 1D:
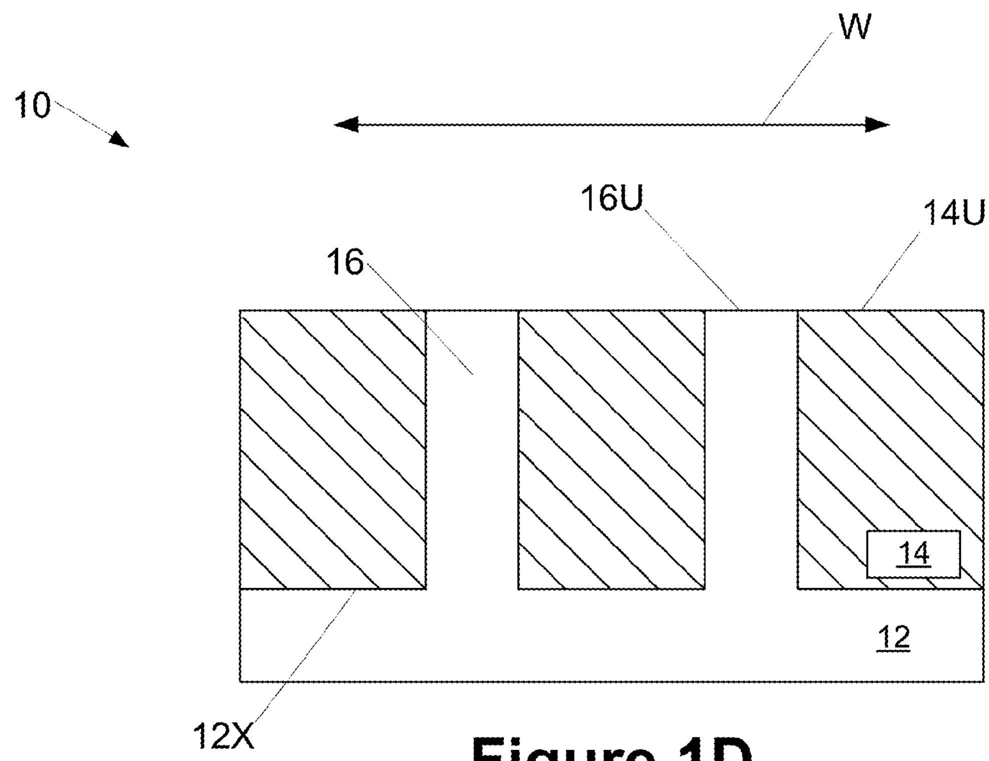
FIGS. 1D-1H depict an example of a prior art aspect ratio trapping process that is used to form fins for a FinFET device.
Figure 1E:
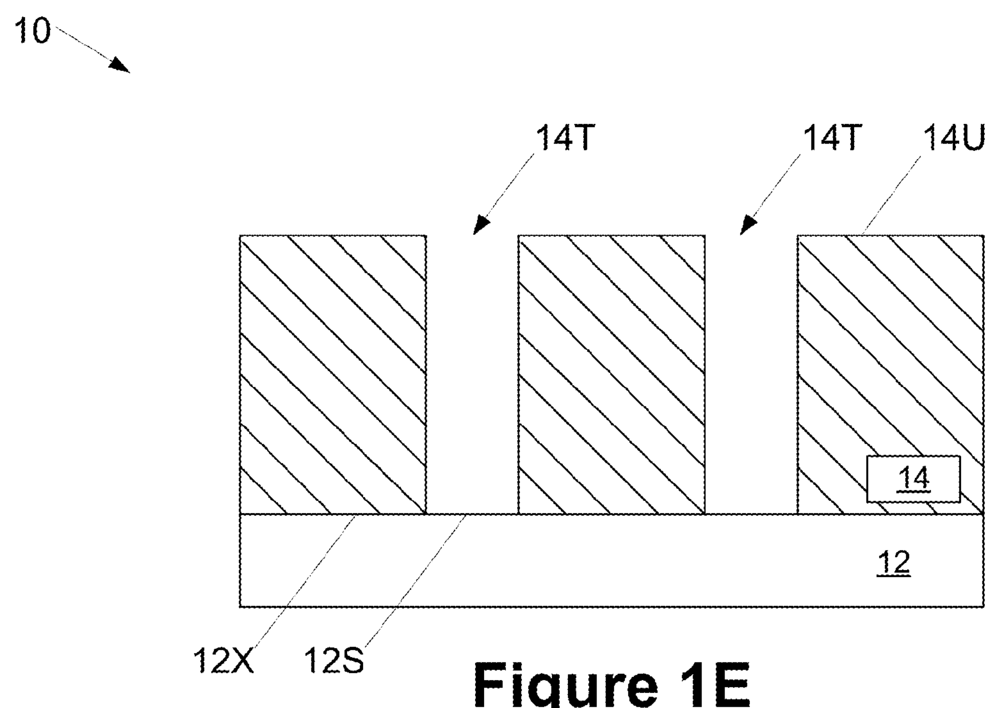
Figure 1F:
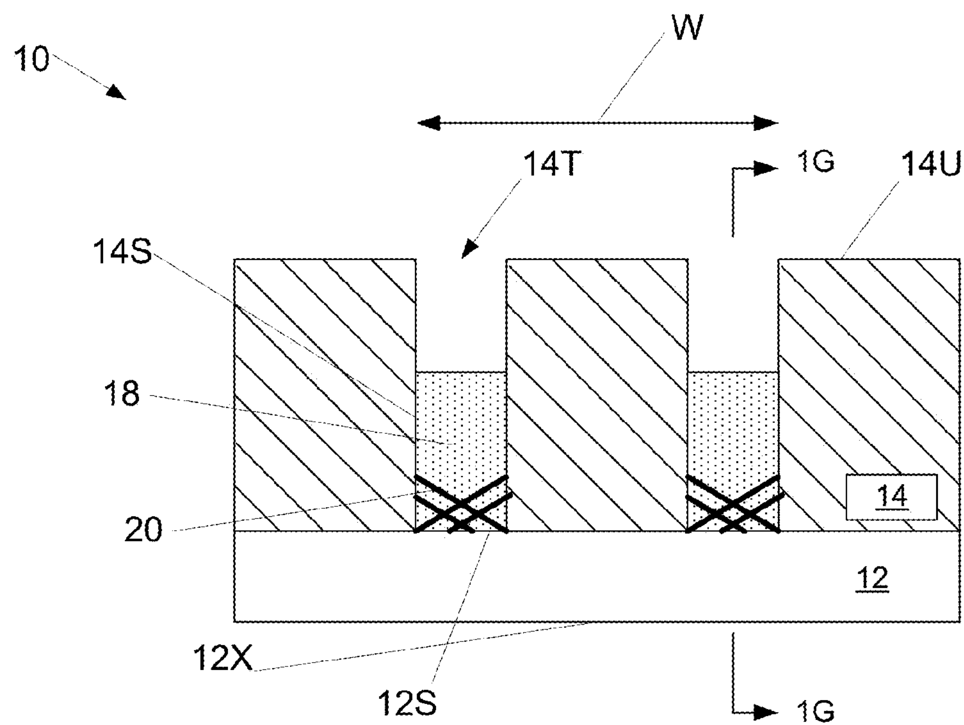
Figure 1G:
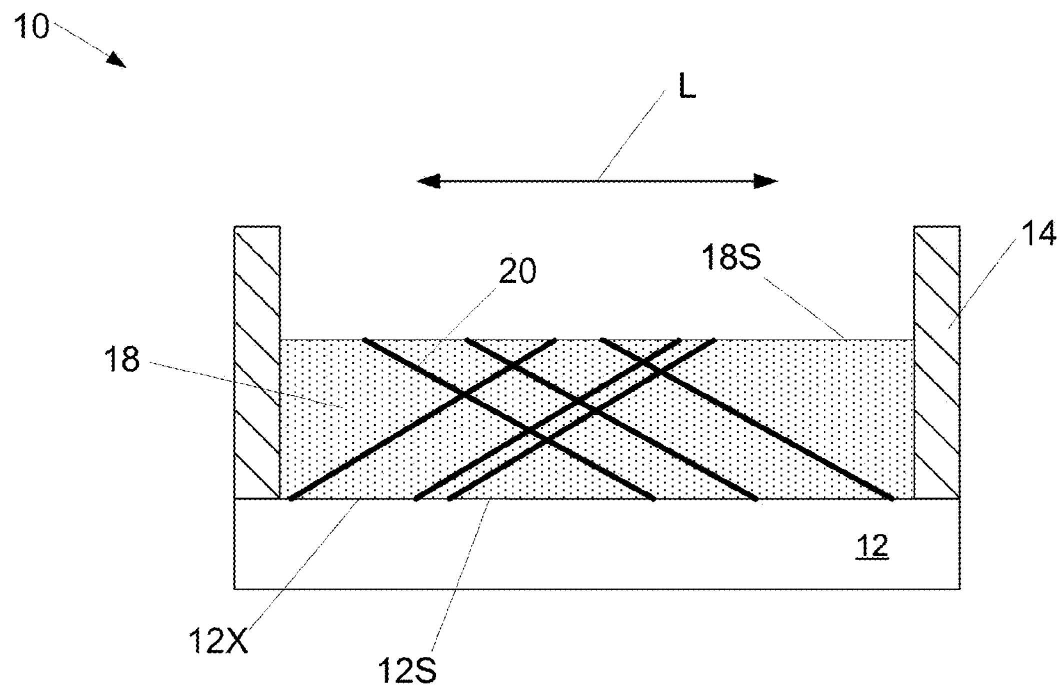
Figure 1H:
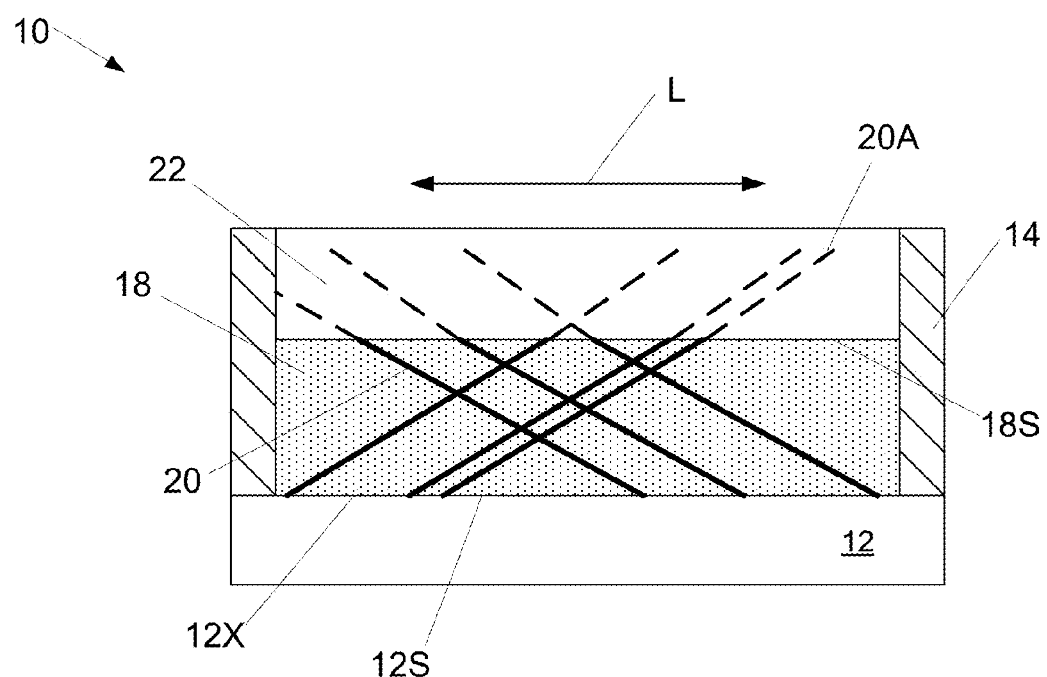
Figure 3C:
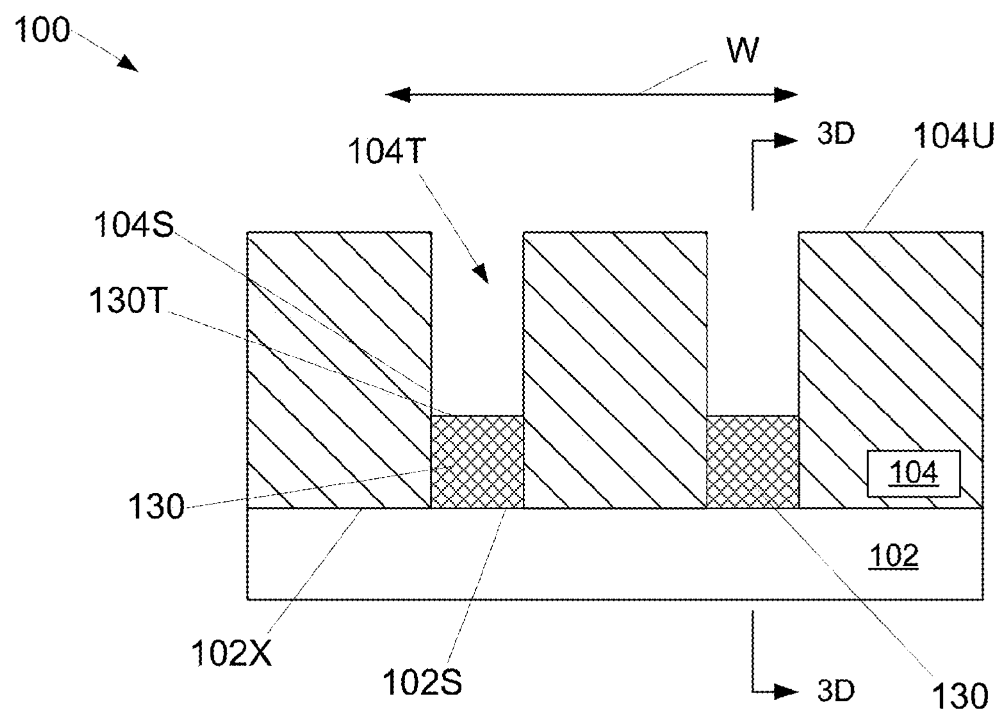
Figure 3D:
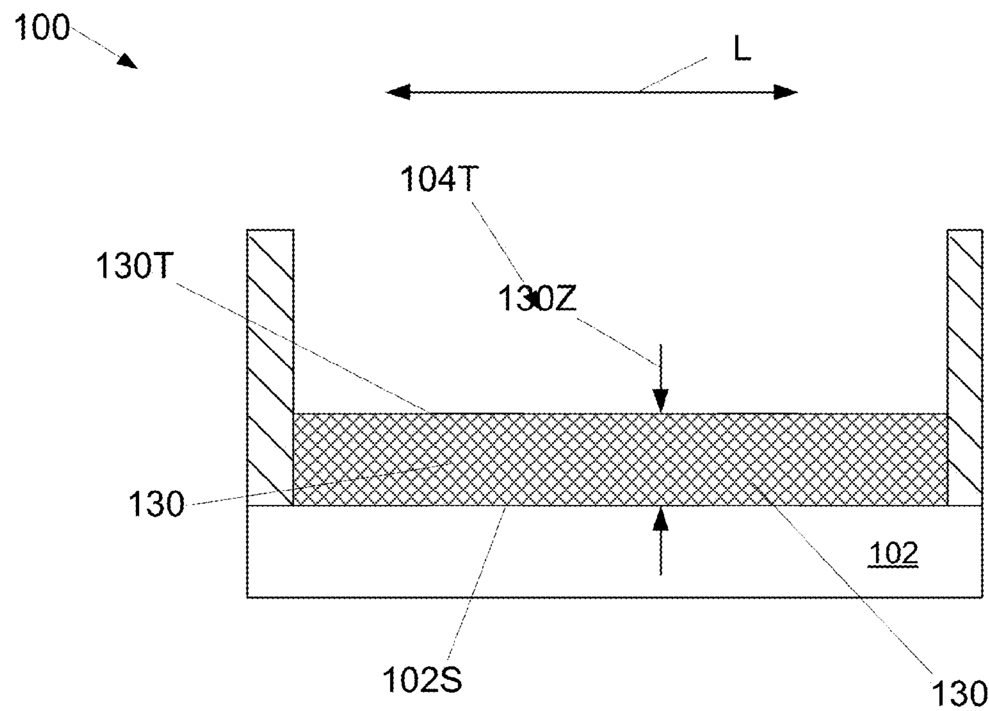

FIGS. 3C and 3D depict the device 100 after the formation a first layer of semiconductor material 130 in the fin trenches 104T by performing an epitaxial deposition process. In this particular embodiment, the first layer of semiconductor material 130 is grown to a thickness 130Z (see FIG. 3D) that is less than the critical thickness of the material 130. As a result, the first layer of semiconductor material 130 is substantially defect-free. The first layer of semiconductor material 130 has an as-deposited or as-formed surface 130T. In one illustrative embodiment, the layer of semiconductor material 130 may be a layer of $SiGe_{0.25}$. Note that, since the first layer of semiconductor material 130 is grown in the relatively confined spaces defined by the fin trenches 104T, its critical thickness may be greater than that anticipated by the chart depicted in FIG. 1B. Also note that the as-formed upper surface 130T of the first layer of semiconductor material 130 is positioned below the upper surface 104U of the layer of insulating material 104.

Figure 3E:
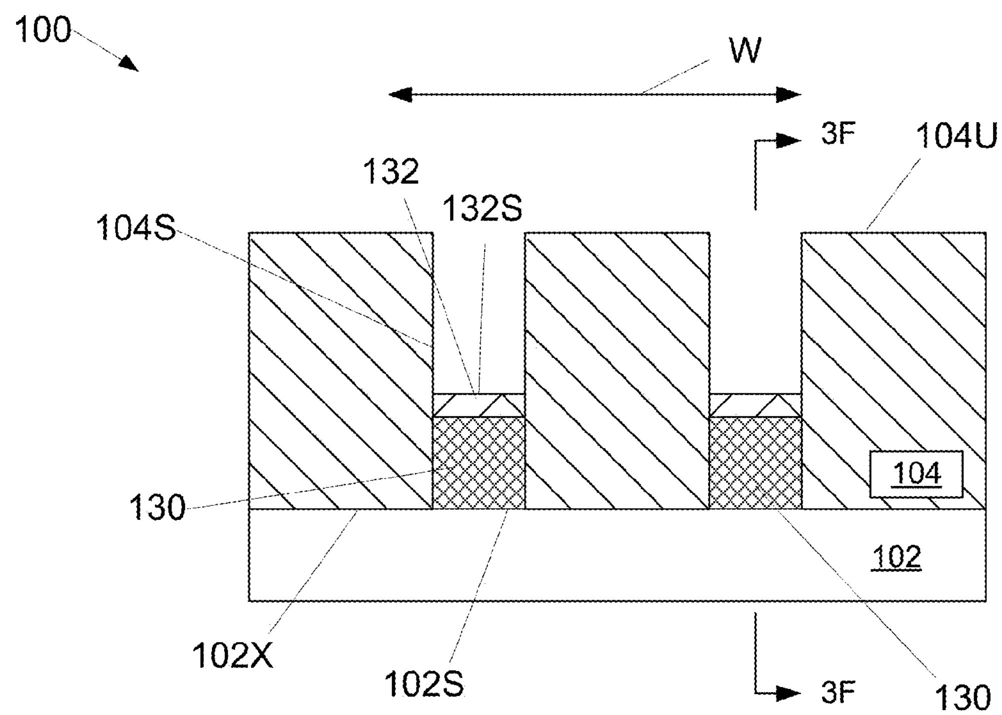
Figure 3F:
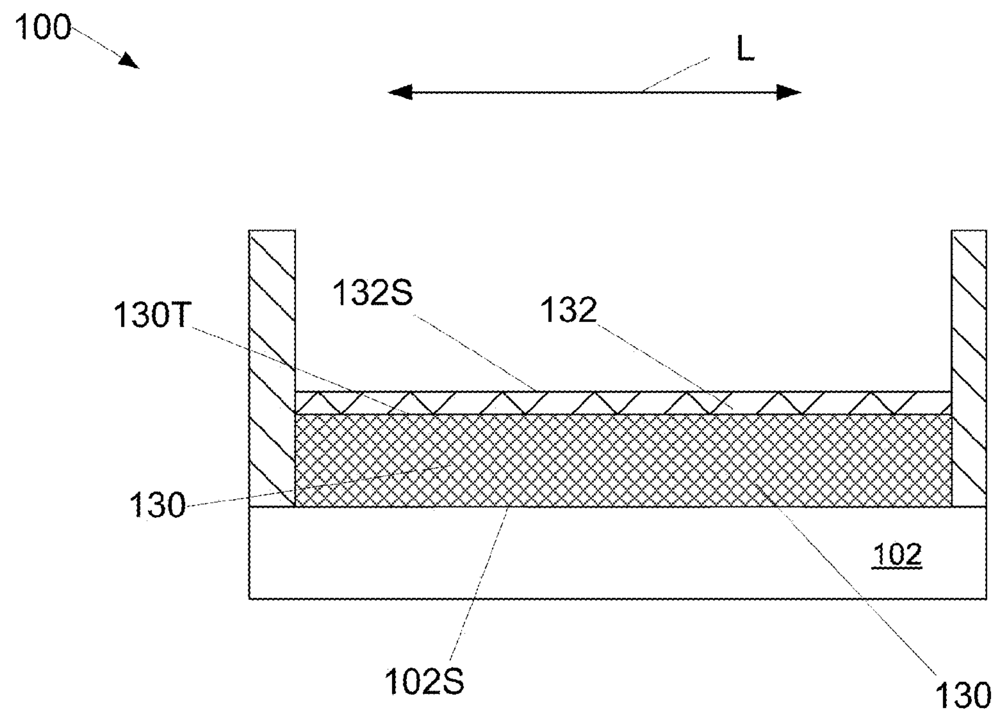

FIGS. 3E-3F depict the device 100 after a second layer of semiconductor material 132, e.g., a layer of silicon, was epitaxially grown on the upper surface 130T of the first layer of semiconductor material 130. Note that, in one embodiment, the second layer of semiconductor material 132 should be formed immediately following the formation of the first layer of semiconductor material 130 in one chamber without breaking vacuum. Since the first layer of semiconductor material 130 was carefully formed such that it thickness 130Z was less than the critical thickness of the material, the upper surface 130T of the first layer of semiconductor material is also substantially free of defects. As a result, the second layer of semiconductor material 132 is also substantially defect-free. In one illustrative embodiment, the second layer of semiconductor material 132 may be formed to a thickness that falls within the range of about 1-10 nm. Also note that the upper surface 132S of the second layer of semiconductor material 132 is positioned below the upper surface 104U of the layer of insulating material 104.

Figure 3G:
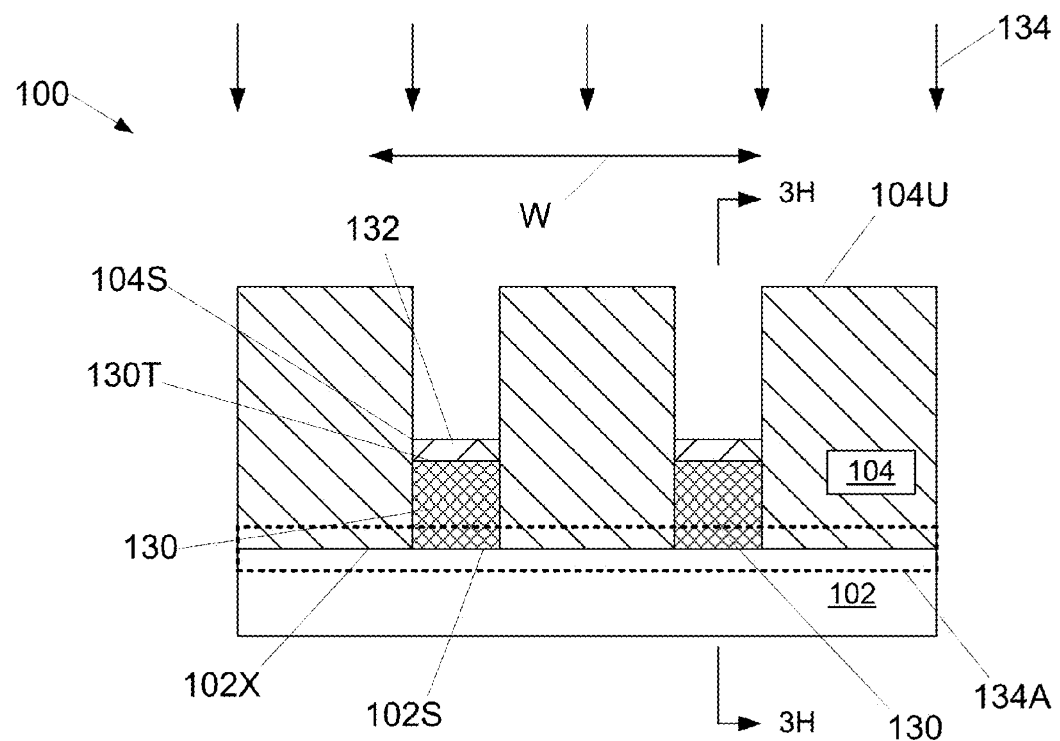
Figure 3H:
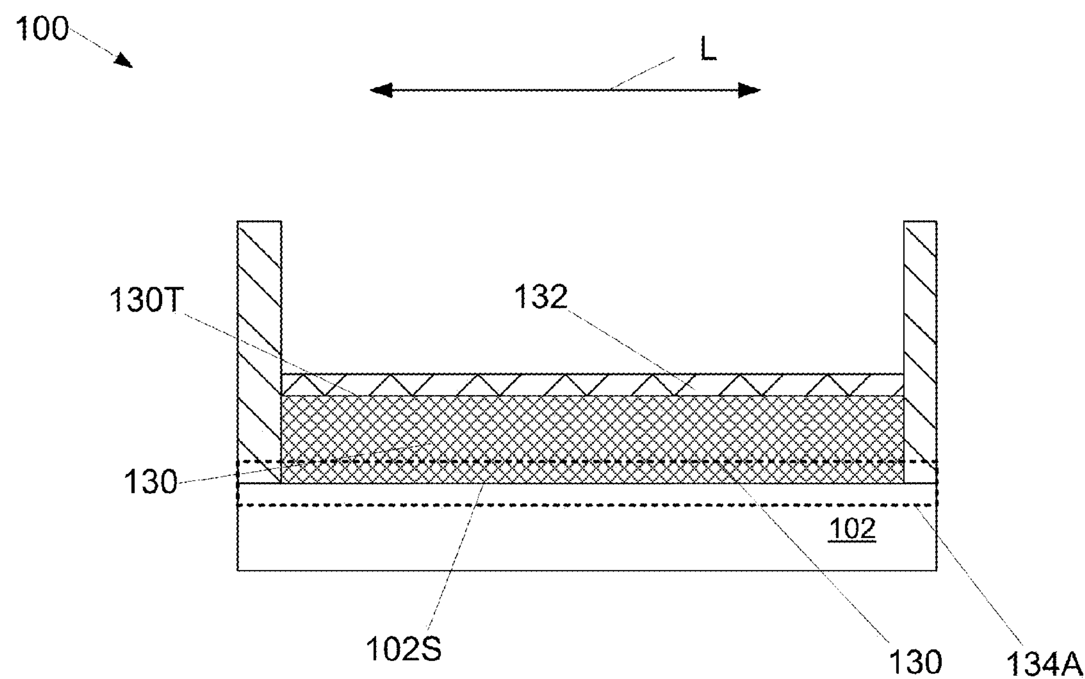

FIGS. 3G-3H depict the device 100 after an ion implantation process 134 was performed to form an implant region 134A in the substrate 102 and the first layer of semiconductor material 130. In one illustrative embodiment, the ion implantation process 134 is performed with an implant energy such that the location of peak concentration of implanted material within the implant region 134A is targeted to be positioned at approximately the interface between the first layer of semiconductor material 130 and the substrate 102 (or remaining portion of the substrate fins 106 if they still exist). In one illustrative embodiment, the ion implantation process 134 may be performed with an ion dose that falls within the range of about 5-100 $e^{13}$ ions/$cm^2$. The particular material implanted may vary depending upon the particular application, e.g., arsenic, silicon, argon. The purpose of forming the implant region 134A is to introduce point defects (not shown) at the interface between the first layer of semiconductor material 130 and the substrate 102.

Figure 3I:
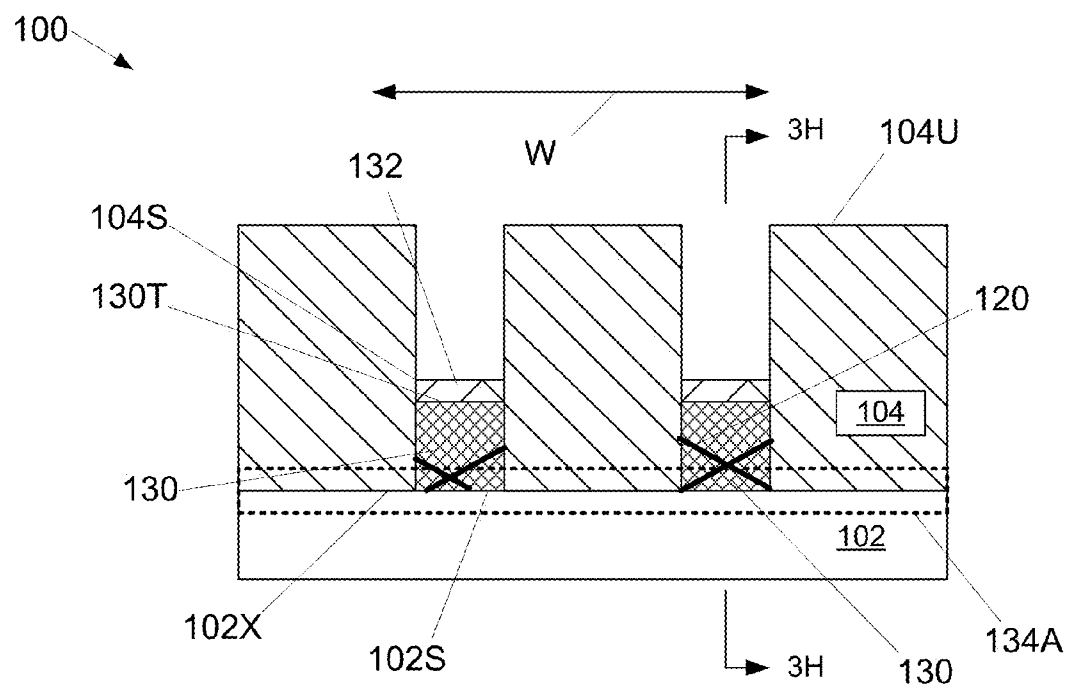
Figure 3J:
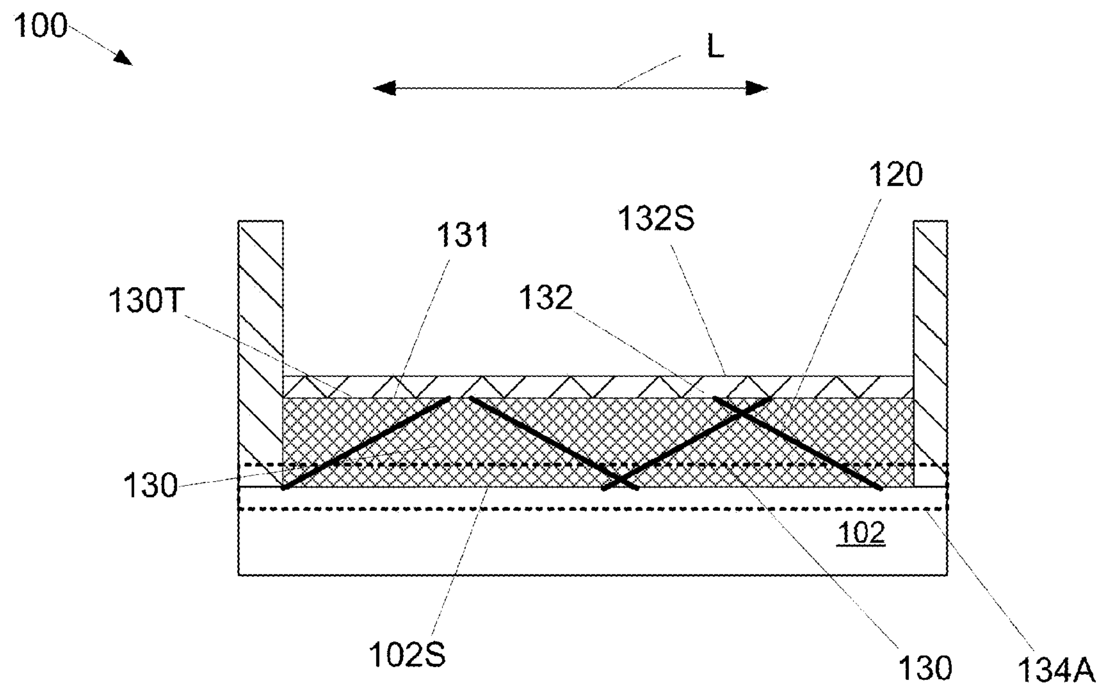

FIGS. 3I-3J depict the device 100 after an anneal process was performed on the device 100 at a temperature that falls within the range of about 700-1100° C. The anneal process results in the formation of the illustrative and simplistically depicted defects 120 in the first layer of semiconductor material 130. With reference to FIG. 3I, the sidewalls 104S of the fin trench 104T stop the propagation of the defects 120 in the gate width (W) direction. With reference to FIG. 3J, unlike the prior art methods discussed in the background section of this application, due to the presence of the second layer of semiconductor material 132, the propagation of the defects 120 in the gate length (L) direction of the device 100 are stopped at the interface 131 between the first layer of semiconductor material 130 and the second layer of semiconductor material 132. As a result, few, if any, of the defects 120 propagate into the second layer of semiconductor material 132. Accordingly, the upper surface 132S of the second layer of semiconductor material 132 is substantially free of the defects 120.

Figure 3K:
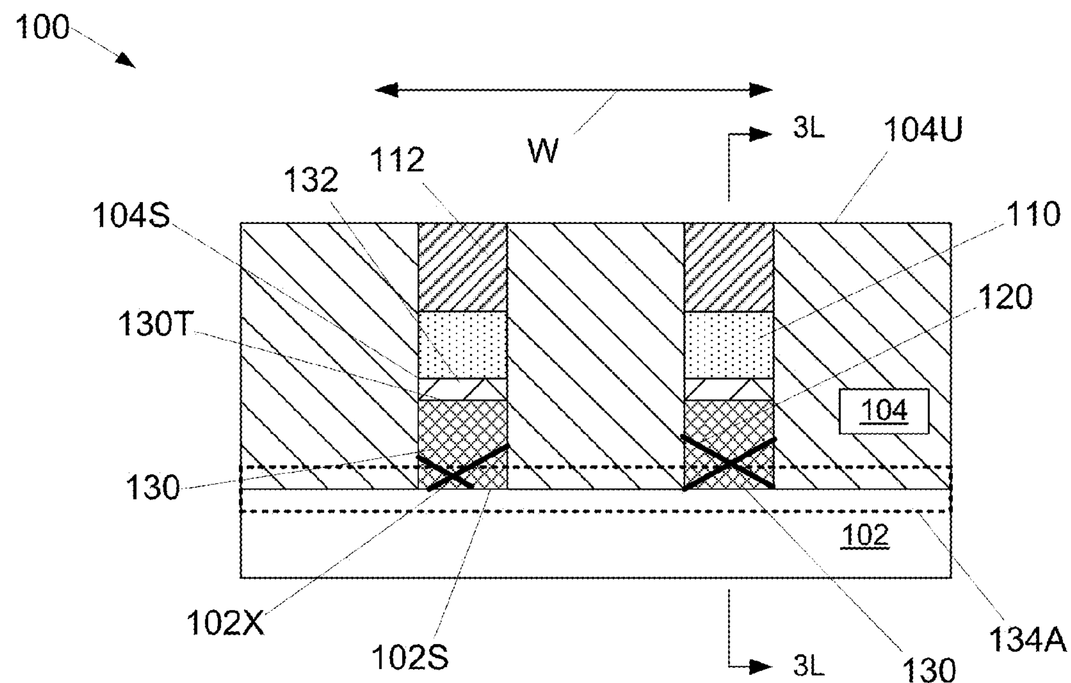
Figure 3L:
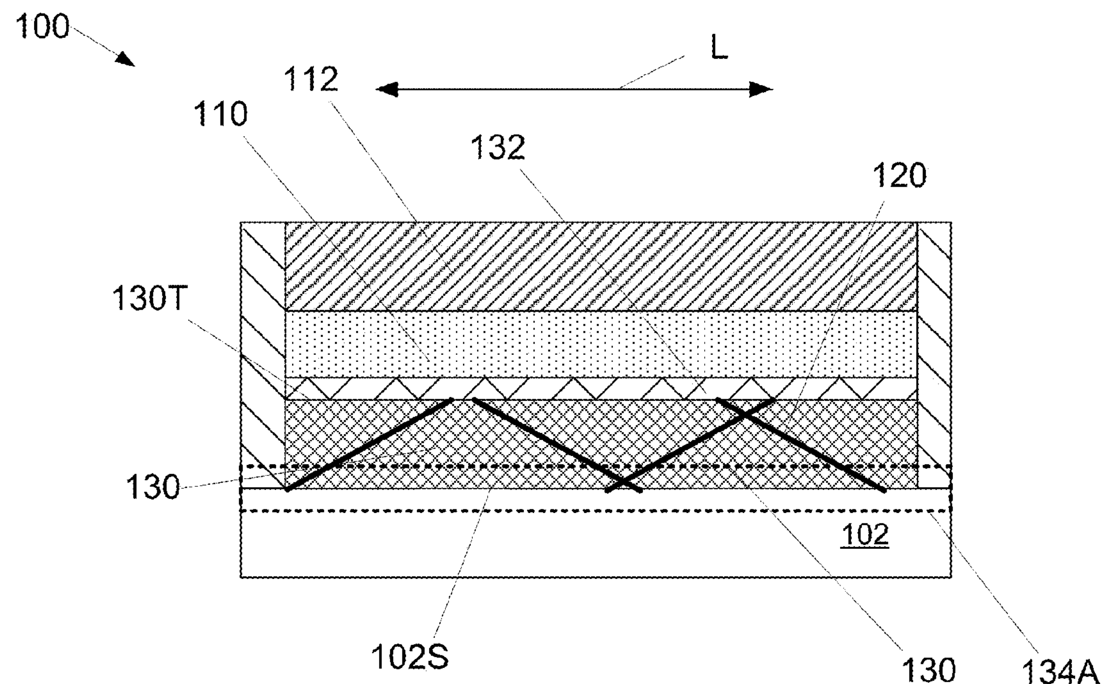

FIGS. 3K-3L depict one embodiment wherein a third layer of semiconductor material, such as the above-described layer of semiconductor material 110 was formed on the second layer of semiconductor material 132 and the above-described channel semiconductor material 112 was formed on the layer of semiconductor material 110 by performing one or more epitaxial growth processes.

At the point of processing depicted in FIGS. 3K-3L, the illustrative FinFET device 100 may be completed using traditional fabrication techniques. For example, the layer of insulating material 104 may be recessed to expose the desired amount of the channel semiconductor material 112, and the above-described gate structure 116, gate cap 117 and spacers 119 may be formed for the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
- forming a plurality of trenches in a semiconductor substrate to thereby define a fin having an upper surface;
- forming a layer of insulating material in said trenches such that the upper surface of said fin is exposed;
- performing at least one etching process to remove at least a portion of said fin and thereby define a fin trench in said layer of insulating material;
- forming a first layer of semiconductor material in said fin trench, said first layer of semiconductor material having an upper surface that is positioned below an upper surface of said layer of insulating material;
- forming a second layer of semiconductor material in said fin trench on said upper surface of said first layer of semiconductor material, said second layer of semiconductor material having an upper surface that is positioned below said upper surface of said layer of insulating material;
- after forming said second layer of semiconductor material, performing an anneal process to induce defect formation in at least said first layer of semiconductor material, wherein, after said anneal process is performed, said upper surface of said second layer of semiconductor material is substantially defect-free;
- forming a layer of channel semiconductor material on said upper surface of said second layer of semiconductor material; and
- forming a gate structure around at least a portion of said channel semiconductor material.

2. The method of claim 1, wherein said first layer of semiconductor material is a single layer of semiconductor material.

3. The method of claim 1, wherein said first layer of semiconductor material is comprised of multiple layers of semiconductor material.

4. The method of claim 2, wherein said first layer of semiconductor material is a single layer of silicon-germanium ($Si_xGe_{1-x}$).

5. The method of claim 4, wherein said first layer of semiconductor material has a substantially uniform germanium concentration that falls within the range of 1-100% germanium.

6. The method of claim 4, wherein said first layer of semiconductor material has a varying concentration of germanium throughout its thickness, said concentration of germanium being higher at a bottom surface of said first layer of semiconductor material than it is at said upper surface of said first layer of semiconductor material.

7. The method of claim 3, wherein at least one of said multiple layers of semiconductor material is a layer of SiGeC.

8. The method of claim 3, wherein said multiple layers of semiconductor material are comprised of multiple layers of SiGeC interleaved with multiple layers of SiGe.

9. The method of claim 1, wherein said second layer of semiconductor material is a single layer of silicon-germanium ($Si_xGe_{1-x}$).

10. The method of claim 9, wherein said second layer of semiconductor material is a layer of $SiGe_{0.25}$.

11. The method of claim 1, wherein said channel semiconductor material is comprised of one of silicon-germanium or silicon.

12. The method of claim 1, wherein said first layer of semiconductor material has a first substantially uniform germanium concentration and said second layer of semiconductor material has a second substantially uniform germanium concentration, said second concentration being less than said first concentration.

13. A method, comprising:
- forming a plurality of trenches in a semiconductor substrate to thereby define a fin having an upper surface;
- forming a layer of insulating material in said trenches such that said upper surface of said fin is exposed;
- performing at least one etching process to remove at least a portion of said fin and thereby define a fin trench in said layer of insulating material;
- forming a first layer of silicon-germanium semiconductor material in said fin trench, said first layer of semiconductor material having an upper surface that is positioned below an upper surface of said layer of insulating material, wherein said first layer of semiconductor material has a varying concentration of germanium throughout its thickness, said concentration of germanium being higher at a bottom surface of said first layer of semiconductor material than it is at said upper surface of said first layer of semiconductor material;
- forming a second layer of semiconductor material in said fin trench on said upper surface of said first layer of semiconductor material, said second layer of semiconductor material having an upper surface that is positioned below said upper surface of said layer of insulating material;
- after forming said second layer of semiconductor material, performing an anneal process to induce defect formation in at least said first layer of semiconductor material, wherein, after said anneal process is performed, said upper surface of said second layer of semiconductor material is substantially defect-free;

forming a layer of channel semiconductor material on said upper surface of said second layer of semiconductor material; and forming a gate structure around at least a portion of said channel semiconductor material.

14. The method of claim 13, wherein said first layer of semiconductor material is a single layer of semiconductor material.

15. The method of claim 13, wherein said second layer of semiconductor material is a single layer of silicon-germanium ($Si_xGe_{1-x}$).

16. The method of claim 15, wherein said second layer of semiconductor material is a layer of $SiGe_{0.25}$.

17. A method, comprising:

forming a plurality of trenches in a semiconductor substrate to thereby define a fin having an upper surface;

forming a layer of insulating material in said trenches such that said upper surface of said fin is exposed;

performing at least one etching process to remove at least a portion of said fin and thereby define a fin trench in said layer of insulating material;

forming at least one layer of a carbon-containing semiconductor material in said fin trench, said at least one layer of a carbon-containing semiconductor material having an upper surface that is positioned below an upper surface of said layer of insulating material;

forming at least one first layer of silicon-germanium on said upper surface of said at least one layer of a carbon-containing semiconductor material, said at least one first layer of silicon-germanium having an upper surface that is positioned below said upper surface of said layer of insulating material;

forming a second layer of silicon-germanium in said fin trench above said upper surface of said at least one first layer of silicon-germanium, said second layer of silicon-germanium having an upper surface that is positioned below said upper surface of said layer of insulating material;

after forming said second layer of silicon-germanium, performing an anneal process to induce defect formation in said at least one layer of a carbon-containing semiconductor material, wherein, after said anneal process is performed, said upper surface of said second layer of silicon-germanium is substantially defect-free;

forming a layer of channel semiconductor material on said upper surface of said second layer of silicon-germanium; and forming a gate structure around at least a portion of said channel semiconductor material.

18. The method of claim 17, wherein said at least one layer of a carbon-containing semiconductor material is made of SiGeC.

19. The method of claim 17, wherein said first layer of silicon-germanium is a layer of $SiGe_{0.25}$.

20. The method of claim 17, wherein said at least one layer of a carbon-containing semiconductor material comprises multiple layers of SiGeC, said at least one first layer of silicon-germanium comprises multiple layers of silicon-germanium, and wherein said multiple layers of SiGeC are interleaved with said multiple layers of SiGe.

21. The method of claim 17, wherein said second layer of silicon-germanium is a layer of $SiGe_{0.25}$.

22. A method, comprising:

forming a plurality of trenches in a semiconductor substrate to thereby define a fin having an upper surface;

forming a layer of insulating material in said trenches such that said upper surface of said fin is exposed;

performing at least one etching process to remove at least a portion of said fin and thereby define a fin trench in said layer of insulating material;

forming a first layer of semiconductor material in said fin trench, said first layer of semiconductor material having an upper surface that is positioned below an upper surface of said layer of insulating material;

forming a second layer of semiconductor material in said fin trench on said upper surface of said first layer of semiconductor material, said second layer of semiconductor material having an upper surface that is positioned below said upper surface of said layer of insulating material;

forming a third layer of semiconductor material in said fin trench on said upper surface of said second layer of semiconductor material, said third layer of semiconductor material having an upper surface that is positioned below said upper surface of said layer of insulating material;

after forming either said second or said third layers of semiconductor material, performing an anneal process to induce defect formation in said first layer of semiconductor material, wherein, after said anneal process is performed, said upper surface of said second layer of semiconductor material is substantially defect-free;

forming a layer of channel semiconductor material on said upper surface of said third layer of semiconductor material; and forming a gate structure around at least a portion of said channel semiconductor material.

23. The method of claim 22, wherein said first layer of semiconductor material is a layer of $SiGe_{0.25}$.

24. The method of claim 23, wherein said second layer of semiconductor material is a layer of silicon.

25. The method of claim 24, wherein said third layer of semiconductor material is a layer of $SiGe_{0.25}$.

* * * * *